United States Patent
Yun

(10) Patent No.: US 12,046,295 B2
(45) Date of Patent: Jul. 23, 2024

(54) CONTROLLER FOR CONTROLLING SEMICONDUCTOR MEMORY DEVICE AND METHOD OF OPERATING THE CONTROLLER

(71) Applicant: SK hynix Inc., Gyeonggi-do (KR)

(72) Inventor: Sang Ho Yun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 198 days.

(21) Appl. No.: 17/528,788

(22) Filed: Nov. 17, 2021

(65) Prior Publication Data

US 2022/0383958 A1 Dec. 1, 2022

(30) Foreign Application Priority Data

May 26, 2021 (KR) .................... 10-2021-0067935

(51) Int. Cl.
*G11C 16/26* (2006.01)
*G06F 11/22* (2006.01)
*G11C 16/04* (2006.01)

(52) U.S. Cl.
CPC .......... *G11C 16/26* (2013.01); *G06F 11/2215* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 8,331,169 B1 * | 12/2012 | Yang ...................... | G11C 16/26 365/210.1 |
| 2014/0026003 A1 * | 1/2014 | Chen ..................... | G11C 29/021 714/708 |
| 2018/0277227 A1 * | 9/2018 | Takizawa ............... | G11C 16/26 |
| 2019/0043588 A1 * | 2/2019 | Fisher .................... | G11C 16/26 |
| 2021/0026718 A1 * | 1/2021 | Huang ................. | G06F 12/0882 |

FOREIGN PATENT DOCUMENTS

| KR | 10-2016-0000055 A | 1/2016 |
|---|---|---|
| KR | 10-2019-0022987 A | 3/2019 |

* cited by examiner

*Primary Examiner* — April Y Blair
*Assistant Examiner* — Matthew W Wahlin
(74) *Attorney, Agent, or Firm* — IP & T GROUP LLP

(57) ABSTRACT

The present technology includes a method of operating a controller capable of controlling a semiconductor memory device including a plurality of memory cells. The method of operating the controller includes sensing error correction failure of data read from the semiconductor memory device, generating a new read voltage for re-reading the data, determining whether the new read voltage belongs to an allowable range depending on a read voltage statistical value of previous read voltages according to which error corrections were successful on previously read data, and determining, based on a result of the determining whether the new read voltage belongs to the allowable range, a read voltage to be used in a next read operation of re-reading the data.

19 Claims, 16 Drawing Sheets

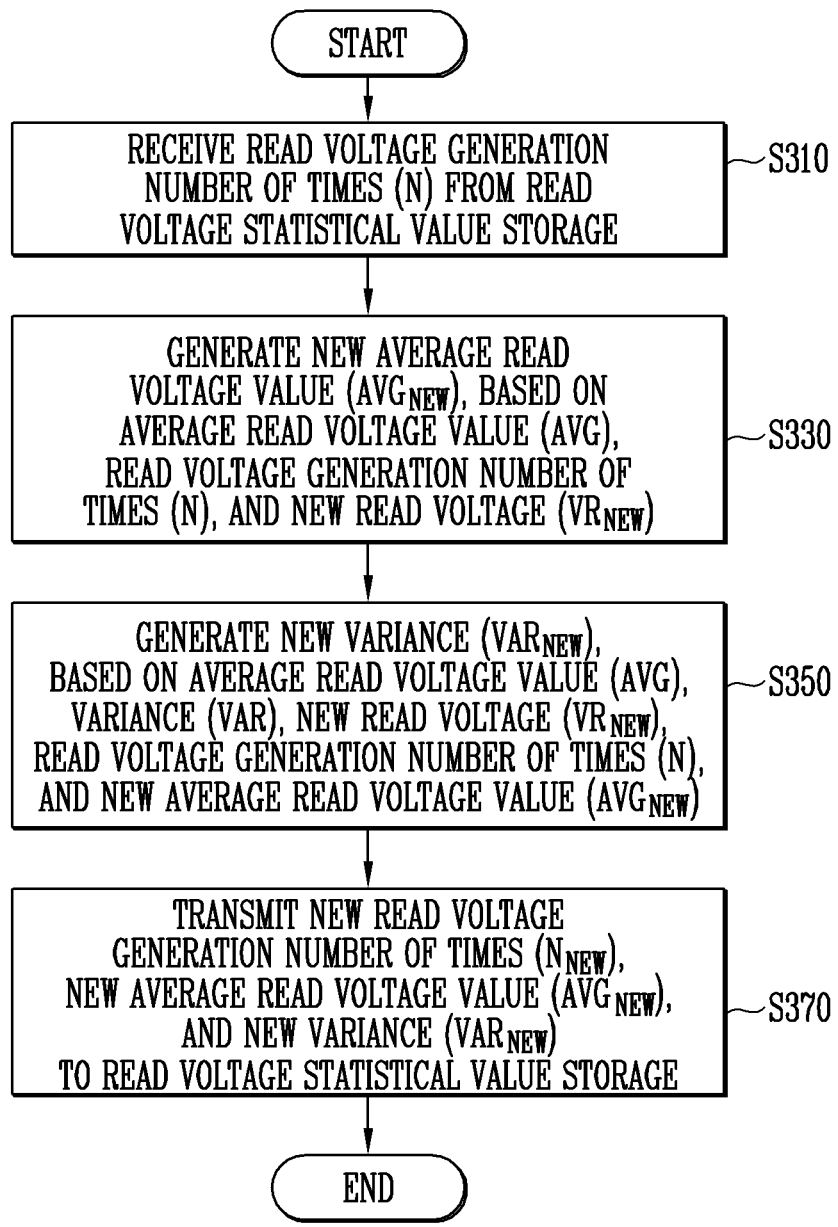

FIG. 13A

| N | VR | AVG | VAR | μ−3σ | μ+3σ | Outlier |
|---|---|---|---|---|---|---|
| 1 | 1 | 1.00 | − | − | − | X |
| 2 | 4 | 2.50 | 4.50 | −3.86 | 8.86 | X |
| 3 | 2 | 2.33 | 2.33 | −2.25 | 6.92 | X |
| 4 | 4 | 2.75 | 2.25 | −1.75 | 7.25 | X |
| 5 | 5 | 3.20 | 2.70 | −1.73 | 8.13 | X |
| 6 | 1 | 2.83 | 2.97 | −2.33 | 8.00 | X |
| 7 | 3 | 2.86 | 2.48 | −1.86 | 7.58 | X |
| 8 | 2 | 2.75 | 2.21 | −1.71 | 7.21 | X |
| 9 | 5 | 3.00 | 2.50 | −1.74 | 7.74 | X |
| 10 | 4 | 3.10 | 2.32 | −1.47 | 7.67 | X |
| 11 | 8 | − | − | − | − | O |

FIG. 13B

| N | VR | AVG | VAR | μ−3σ | μ+3σ | Outlier |
|---|---|---|---|---|---|---|
| 1 | 1 | 1.00 | − | − | − | X |
| 2 | 4 | 2.50 | 4.50 | −3.86 | 8.86 | X |
| 3 | 2 | 2.33 | 2.33 | −2.25 | 6.92 | X |
| 4 | 4 | 2.75 | 2.25 | −1.75 | 7.25 | X |
| 5 | 5 | 3.20 | 2.70 | −1.73 | 8.13 | X |
| 6 | 1 | 2.83 | 2.97 | −2.33 | 8.00 | X |
| 7 | 3 | 2.86 | 2.48 | −1.86 | 7.58 | X |
| 8 | 2 | 2.75 | 2.21 | −1.71 | 7.21 | X |
| 9 | 5 | 3.00 | 2.50 | −1.74 | 7.74 | X |
| 10 | 4 | 3.10 | 2.32 | −1.47 | 7.67 | X |
| 11 | 3.1 | 3.10 | 2.09 | −1.24 | 7.44 | X |

US 12,046,295 B2

CONTROLLER FOR CONTROLLING SEMICONDUCTOR MEMORY DEVICE AND METHOD OF OPERATING THE CONTROLLER

CROSS-REFERENCE TO RELATED APPLICATION

The present application claims priority under 35 U.S.C. § 119(a) to Korean patent application number 10-2021-0067935 filed on May 26, 2021, the entire disclosure of which is incorporated by reference herein.

BACKGROUND

1. Field of Invention

The present disclosure relates to an electronic device, and more particularly, to a controller for controlling a semiconductor memory device and a method of operating the controller.

2. Description of Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional memory device is a memory device designed in order to resolve a limit of an integration degree of a two-dimensional semiconductor memory device, and may include a plurality of memory cells that are vertically stacked on a semiconductor substrate. A controller may control an operation of the semiconductor memory device.

SUMMARY

An embodiment of the present disclosure provides a controller and a method of operating the same capable of improving read performance.

According to an embodiment of the present disclosure, a semiconductor memory device including a plurality of memory cells may be controlled by a method of operating a controller. The method of operating the controller includes sensing error correction failure of data read from the semiconductor memory device, generating a new read voltage for re-reading the data, determining whether the new read voltage belongs to an allowable range depending on a read voltage statistical value of previous read voltages according to which error corrections were successful on previously read data, and determining, based on a result of the determining whether the new read voltage belongs to the allowable range, a read voltage to be used in a next read operation of re-reading the data.

In an embodiment of the present disclosure, the read voltage statistical value may include an average and variance of the previous read voltages. The determining whether the new read voltage belongs to the allowable range may include calculating a standard deviation from the variance, and determining whether the new read voltage belongs to a section between 'AVG−k·σ' and 'AVG+k·σ', where 'AVG' may be the average, 'σ' may be the standard deviation, and 'k' may be a predetermined positive number.

In an embodiment of the present disclosure, the determining the read voltage may include determining the new read voltage as the read voltage to be used in the next read operation when the new read voltage is determined to belong to the section.

In an embodiment of the present disclosure, the method may further include controlling the semiconductor memory device to perform the next read operation using the new read voltage, and receiving the data re-read from the semiconductor memory device through the next read operation.

In an embodiment of the present disclosure, the method may further include updating the read voltage statistical value based on the new read voltage when error correction for the re-read data is successful.

In an embodiment of the present disclosure, the updating the read voltage statistical value may include generating a new average based on the average of the previous read voltages, a number of the previous read voltages, and the new read voltage, and generating a new variance based on the average of the previous read voltages, the variance of the previous read voltages, the new read voltage, the number of the previous read voltages, and the new average.

In an embodiment of the present disclosure, the new average may be generated using the following equation.

$$AVG_{NEW} = \frac{N \cdot AVG + VR_{NEW}}{N+1}$$

Here, '$AVG_{NEW}$' may be the new average, 'N' may be the number of the previous read voltages, and '$VR_{NEW}$' may be the new read voltage.

In an embodiment of the present disclosure, the new variance may be generated using the following equation.

$$VAR_{NEW} = \frac{VAR \cdot (N-1) + (VR_{NEW} - AVC) \cdot (VR_{NEW} - AVG_{NEW})}{N}.$$

Here, '$VAR_{NEW}$' may be the new variance and 'VAR' may be the variance.

In an embodiment of the present disclosure, the method may further include generating a new read voltage for re-reading the data related to the error correction failure when error correction for the re-read data has failed.

In an embodiment of the present disclosure, the determining the read voltage may include determining the average as the read voltage to be used in the next read operation when the new read voltage is determined not to belong to the section.

In an embodiment of the present disclosure, the method may further include controlling the semiconductor memory device to perform the next read operation using the average, and receiving the data re-read from the semiconductor memory device through the next read operation.

In an embodiment of the present disclosure, the method may further include updating the read voltage statistical value based on the average when error correction for the re-read data is successful.

According to another embodiment of the present disclosure, a semiconductor memory device including a plurality of memory cells may be controlled by a controller. The controller includes a read controller and an error correction block. The read controller controls an operation for reading data stored in the semiconductor memory device. The error correction block performs an error correction operation on the data read from the semiconductor memory device. The read controller may control the operation by generating a new read voltage for re-reading the data when there is an error correction failure for the data, determining whether the new read voltage belongs to an allowable range depending on a read voltage statistical value of previous read voltages according to which error corrections were successful on previously read data, and determining, based on a result of the determining whether the new read voltage belongs to the allowable range, a read voltage to be used in a next read operation of re-reading the data.

In an embodiment of the present disclosure, the read controller may include a read voltage statistical value storage, a read voltage generator, and a read voltage determiner. The read voltage statistical value storage may be configured to store the read voltage statistical value. The read voltage generator may be configured to generate the new read voltage. The read voltage determiner may be configured to determine whether the new read voltage belongs to the allowable range.

In an embodiment of the present disclosure, the read voltage statistical value may include an average and a variance of the previous read voltages. The read voltage determiner may determine whether the new read voltage belongs to the allowable range by calculating a standard deviation from the variance, and determining that the new read voltage belongs to the allowable range when the new read voltage belongs to a section between values 'AVG−k·σ' and 'AVG+k·σ', where 'AVG' is the average, 'σ' is the standard deviation and 'k' is a predetermined positive number. The read voltage determiner may be further configured to generate a setting command for controlling the semiconductor memory device to use the new read voltage in the next read operation.

In an embodiment of the present disclosure, the read voltage determiner may be further configured to generate, when error correction is successful for the re-read data received as a result of the next read operation, a new read voltage statistical value reflecting the new read voltage, and to transmit the generated new read voltage statistical value to the read voltage statistical value storage.

In an embodiment of the present disclosure, the read voltage determiner may generate the new read voltage statistical value by generating a new average using the following equation.

$$AVG_{NEW} = \frac{N \cdot AVG + VR_{NEW}}{N+1}$$

Here, '$AVG_{NEW}$' may be the new average, 'N' may be the number of the previous read voltages, and '$VR_{NEW}$' may be the new read voltage.

In an embodiment of the present disclosure, the read voltage determiner may generate the new read voltage statistical value further by generating a new variance using the following equation.

$$VAR_{NEW} = \frac{VAR \cdot (N-1) + (VR_{NEW} - AVC) \cdot (VR_{NEW} - AVG_{NEW})}{N}$$

Here, '$VAR_{NEW}$' may be the new variance and 'VAR' may be the variance.

In an embodiment of the present disclosure, the statistical value may include an average and a variance of the previous read voltages. The read voltage determiner may determine whether the new read voltage belongs to the allowable range by calculating a standard deviation from the variance, determining that the new read voltage does not belong to the allowable range when the new read voltage does not belong to a section between values 'AVG−k·σ' and 'AVG+k·σ', where 'AVG' is the average, 'σ' is the standard deviation and 'k' is a predetermined positive number. The read voltage determiner may be further configured to generate a setting command for controlling the semiconductor memory device to use the average in the next read operation.

In an embodiment of the present disclosure, the read voltage generator may generate the new read voltage using a read retry table.

According to still another embodiment of the present disclosure, an operating method of a controller includes selecting, when a previous read operation fails on data according to a previous read voltage, one of first and second read voltages based on whether the first read voltage falls within a range, the first read voltage being selected from a read retry table, the second read voltage being an average of successful read voltages, according to which previous read operations are successful, and the range depending on the average and a standard deviation of the successful read voltages, controlling a memory device to perform a current read operation on the data according to the selected read voltage, and updating the average and the standard deviation based on the selected read voltage when the current read operation is successful.

The present technology may provide a controller and a method of operating the same capable of improving read performance.

BRIEF DESCRIPTION OF THE DRAWINGS

FIG. 12 is a flowchart illustrating operation S190 according to an embodiment of the present disclosure.

FIGS. 13A and 13B are tables illustrating a method of operating a controller according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification.

Figure 1:
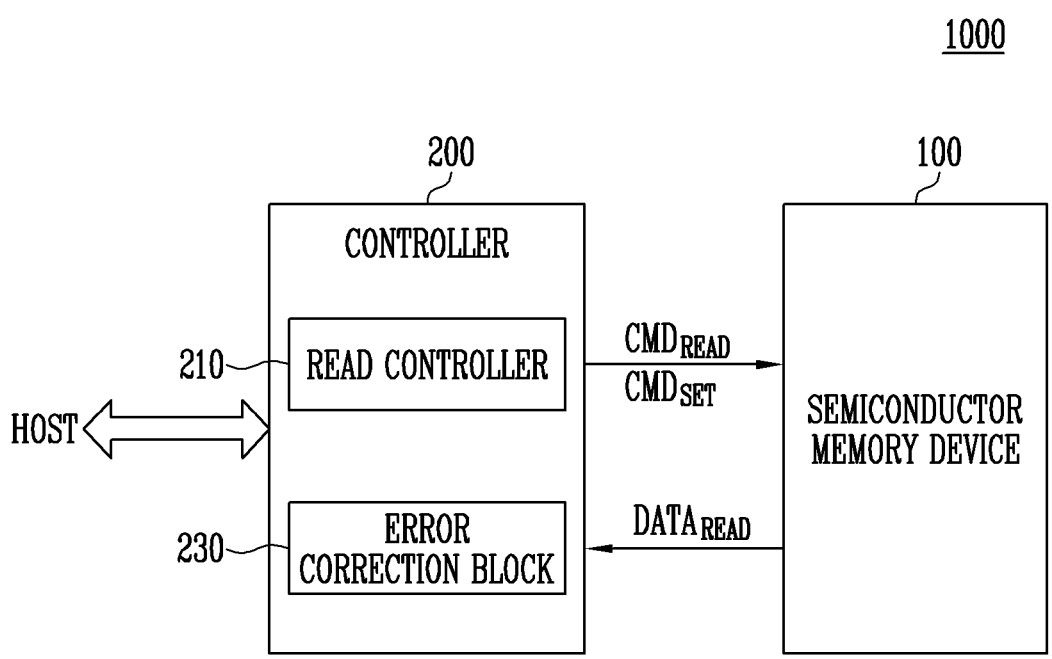
FIG. 1 is a block diagram illustrating a memory system including a controller according to an embodiment of the present disclosure.

FIG. 1 is a block diagram illustrating a memory system including a controller according to an embodiment of the present disclosure.

Referring to FIG. 1, the memory system 1000 includes a semiconductor memory device 100 and a controller 200. In addition, the memory system 1000 communicates with a host. Each of the semiconductor memory device 100 and the controller 200 may be provided as one chip, one package, and one device. Alternatively, the memory system 1000 may be provided as one storage device.

The controller 200 controls an overall operation of the semiconductor memory device 100. In addition, the controller 200 controls an operation of the semiconductor memory device 100 based on a command request received from the host.

The semiconductor memory device 100 operates under control of the controller 200. The semiconductor memory device 100 includes a memory cell array having a plurality of memory blocks. In an embodiment, the semiconductor memory device 100 may be a flash memory device.

The controller 200 may receive a write request or a read request for data from the host, and control the semiconductor memory device 100 based on the received requests. More specifically, the controller 200 may generate commands for controlling the operation of the semiconductor memory device 100 and transmit the commands to the semiconductor memory device 100.

In order to read data stored in the semiconductor memory device 100, the controller 200 may transmit a read command $CMD_{READ}$ to the semiconductor memory device 100.

The semiconductor memory device 100 is configured to receive a command and an address from the controller 200 and to access an area selected by the address of the memory cell array. That is, the semiconductor memory device 100 performs an internal operation corresponding to a command on the area selected by the address.

For example, the semiconductor memory device 100 may perform a program operation, a read operation, and an erase operation. During the program operation, the semiconductor memory device 100 may program data in the area selected by the address. During the read operation, the semiconductor memory device 100 may read data from the area selected by the address. During the erase operation, the semiconductor memory device 100 may erase data stored in the area selected by the address.

In particular, the semiconductor memory device 100 may perform a read operation of data in response to the read command $CMD_{READ}$ received from the controller 200. The semiconductor memory device 100 may transmit read data $DATA_{READ}$ calculated as a result of the read operation to the controller 200.

The controller 200 includes a read controller 210 and an error correction block 230.

The read controller 210 may control an overall operation for reading the data stored in the semiconductor memory device 100. For example, the read controller 200 may manage and control a read voltage for reading the data stored in the semiconductor memory device 100. For example, when the data read from the semiconductor memory device 100 is not corrected by the error correction block 230, the read controller 210 may control at least one read voltage used in the read operation of the semiconductor memory device 100.

For example, in order to control the read voltage used in the read operation of the semiconductor memory device 100, the read controller 210 of the controller 200 may transmit a setting command $CMD_{SET}$ to the semiconductor memory device 100. The semiconductor memory device 100 may change the read voltage used in the read operation in response to the received setting command $CMD_{SET}$.

The error correction block 230 is configured to detect and correct an error of the data received from the semiconductor memory device 100 using an error correction code (ECC). The read controller 210 may control the semiconductor memory device 100 to control the read voltage and perform a re-read according to an error detection result of the error correction block 230. For example, the error correction block 230 may generate an error correction code for data to be stored in the semiconductor memory device 100. The generated error correction code may be stored in the semiconductor memory device 100 together with the data. Thereafter, the error correction block 230 may detect and correct the error of the data read from the semiconductor memory device 100, based on the stored error correction code. For example, the error correction block 230 has a predetermined error correction capability. Data including an error bit (or fail bit) exceeding the error correction capability of the error correction block 230 is referred to as 'uncorrectable ECC (UECC) data'. When the data read from the semiconductor memory device 100 is the UECC data, the read controller 210 may control the read voltages. Thereafter, the controller 200 may control the semiconductor memory device 100 to perform the read operation again by using the controlled read voltage.

Figure 2:
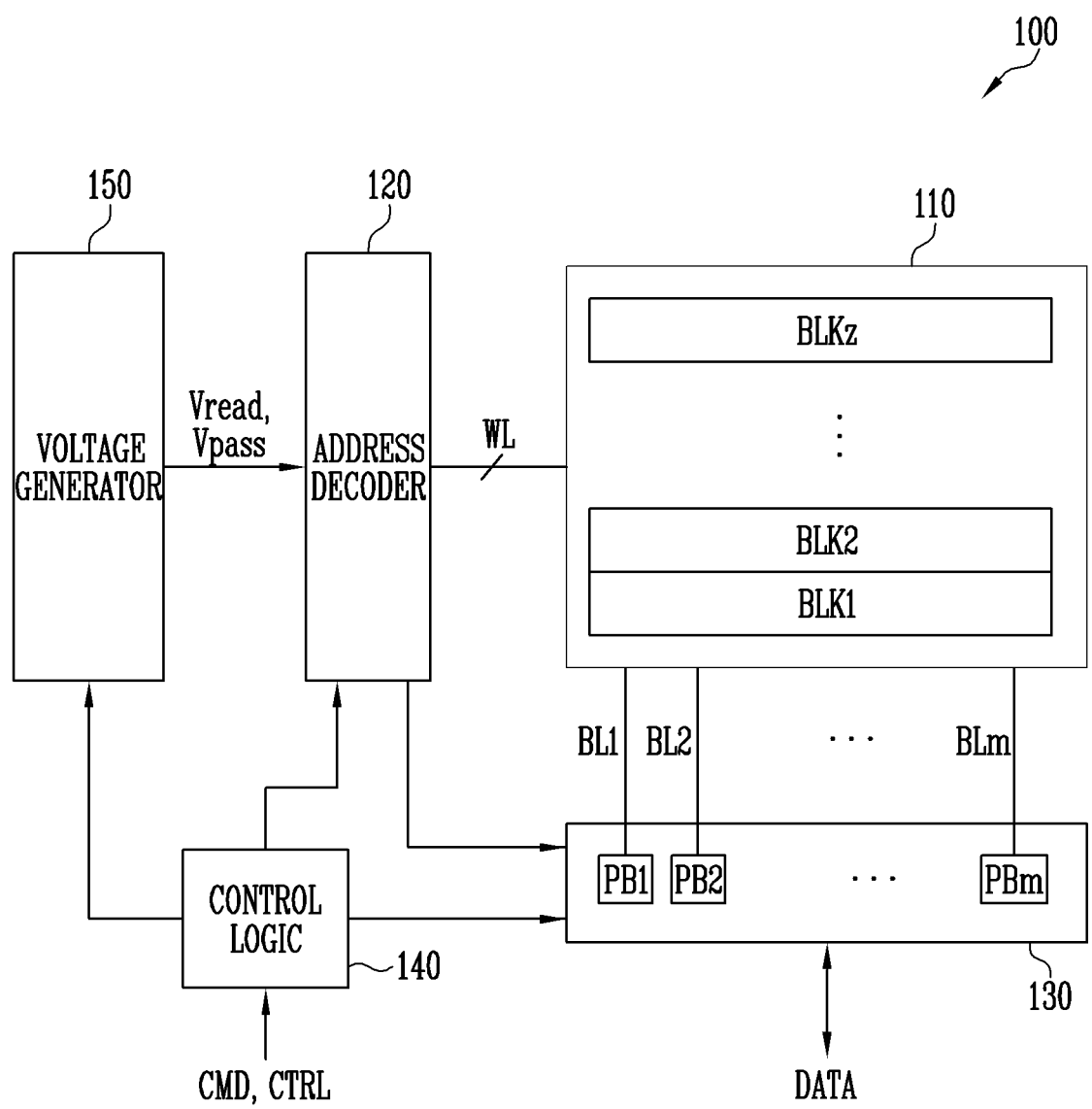
FIG. 2 is a block diagram illustrating an example of a semiconductor memory device shown in FIG. 1 according to an embodiment of the present disclosure.

FIG. 2 is a block diagram illustrating an example of the semiconductor memory device 100 shown in FIG. 1 according to an embodiment of the present disclosure.

Referring to FIG. 2, the semiconductor memory device 100 includes a memory cell array 110, an address decoder 120, a read and write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Each of the plurality of memory cells included in the memory cell array 110 may store at least one bit of data. In an embodiment, each of the plurality of memory cells included in the memory cell array 110 may be a single-level cell (SLC) storing data of one bit. In another embodiment, each of the plurality of memory cells included in the memory cell array 110 may be a multi-level cell (MLC) storing data of two bits. In still another embodiment, each of the plurality of memory cells included in the memory cell array 110 may be a triple-level cell (TLC) storing data of three bits. In still another embodiment, each of the plurality of memory cells included in the memory cell array 110 may be a quad-level cell (QLC) storing data of four bits. According to an embodiment, the memory cell array 110 may include a plurality of memory cells each storing data of five or more bits.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130. In the present specification, memory cells connected to one word line may be referred to as one "physical page".

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for controlling a sensing node pre-charge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 3:
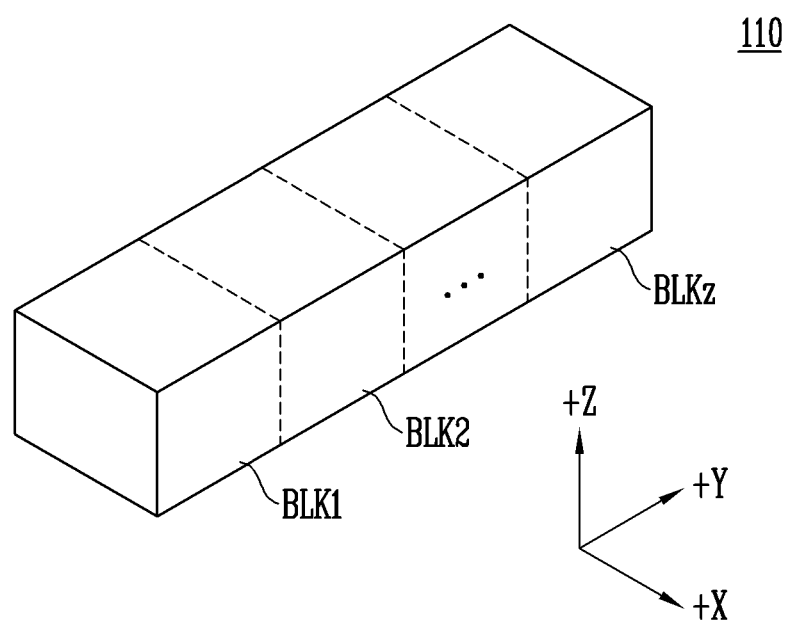
FIG. 3 is a diagram illustrating an example of a memory cell array of FIG. 2 according to an embodiment of the present disclosure.

FIG. 3 is a diagram illustrating an example of the memory cell array of FIG. 2 according to an embodiment of the present disclosure.

Referring to FIG. 3, the memory cell array 110 includes a plurality of memory blocks BLK1 to BLKz. Each memory block may have a three-dimensional structure. Each memory block includes a plurality of memory cells stacked on a substrate. The plurality of memory cells are arranged along a +X direction, a +Y direction, and a +Z direction. A structure of each memory block is described in more detail with reference to FIGS. 4 and 5.

Figure 4:
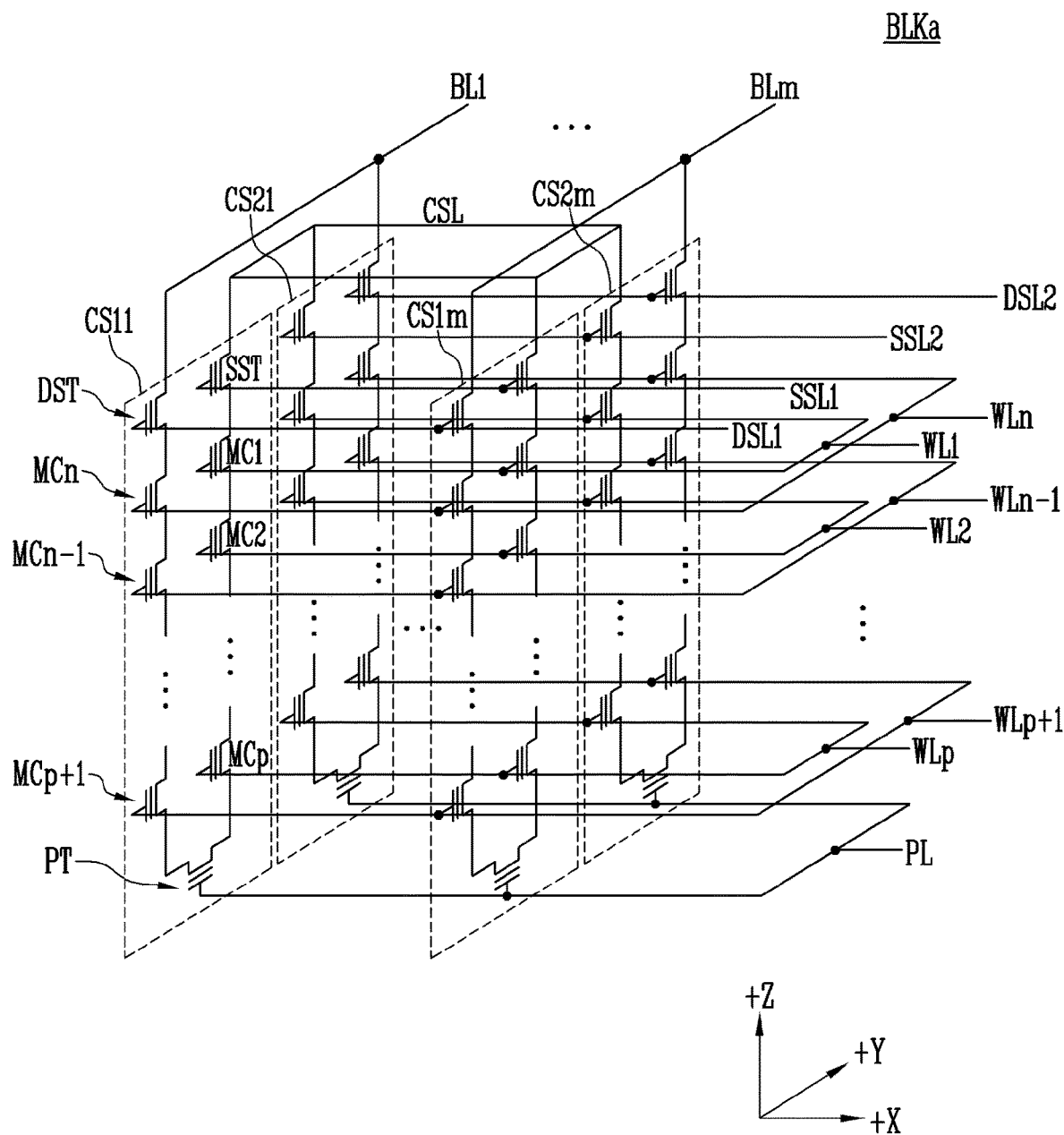
FIG. 4 is a circuit diagram illustrating a memory block BLKa of memory blocks BLK1 to BLKz of FIG. 3 according to an embodiment of the present disclosure.

FIG. 4 is a circuit diagram illustrating a memory block BLKa of the memory blocks BLK1 to BLKz of FIG. 3 according to an embodiment of the present disclosure.

Referring to FIG. 4, the memory block BLKa includes a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1$m$ of a first row are connected to a first source select line SSL1. The source select transistors of the cell strings CS21 to CS2$m$ of a second row are connected to a second source select line SSL2.

In another embodiment, the source select transistors of the cell strings CS11 to CS1$m$ and CS21 to CS2$m$ may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The drain select transistors DST of the cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1$m$ and CS2$m$ of the m-th column are connected to the m-th bit line BLm.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting one of the drain select lines DSL1 and DSL2. One page of the selected cell strings may be selected by selecting one of the word lines WL1 to WLn.

In another embodiment, even bit lines and odd bit lines may be provided instead of the first to m-th bit lines BL1 to BLm. In addition, even-numbered cell strings among the cell strings CS11 to CS1$m$ or CS21 to CS2$m$ arranged in the row direction may be connected to the even bit lines, and odd-numbered cell strings among the cell strings CS11 to CS1$m$ or CS21 to CS2$m$ arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less dummy memory cells are provided, the size of the memory block BLKa may be reduced, however, the reliability of the operation on the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
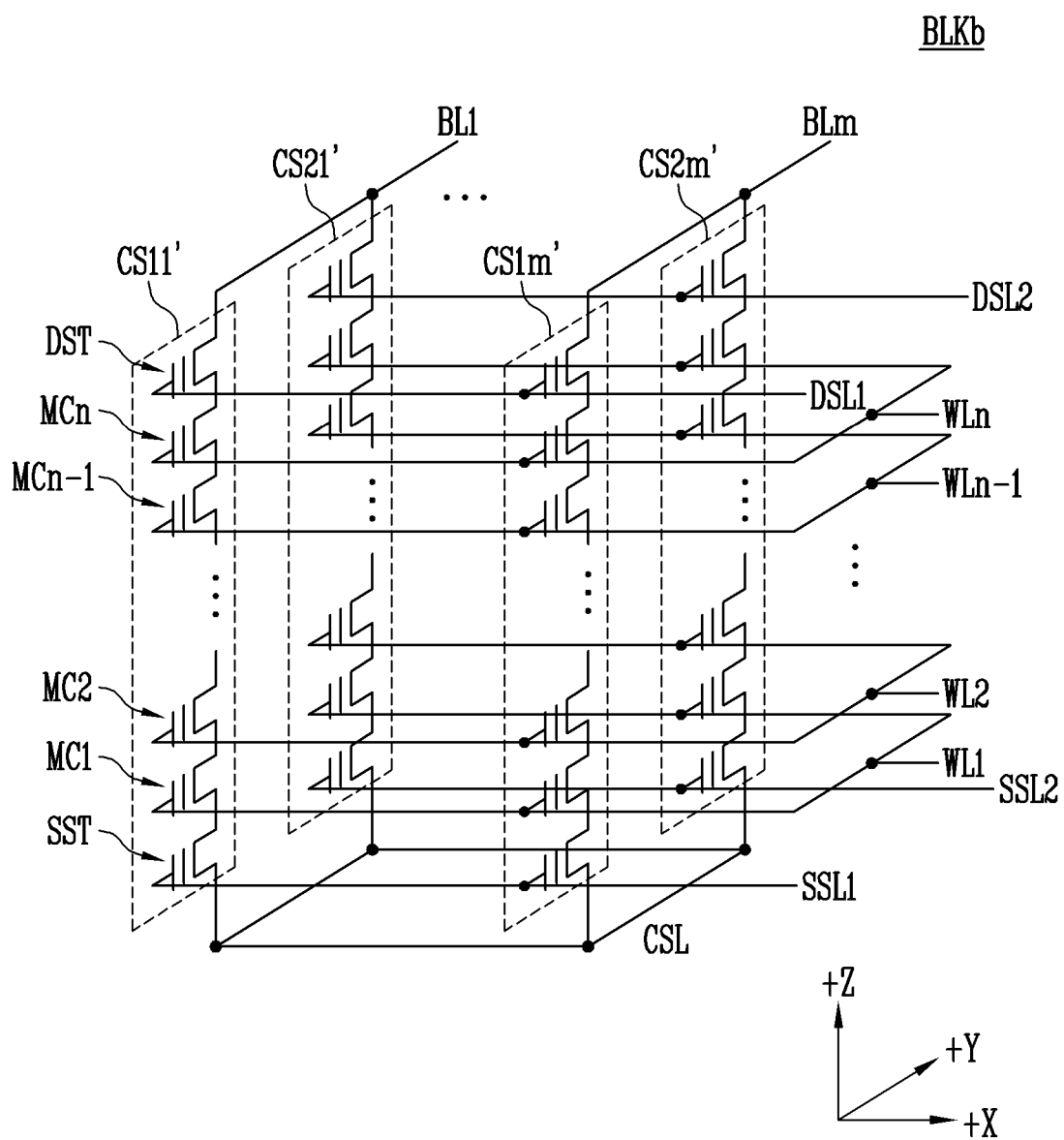
FIG. 5 is a circuit diagram illustrating another memory block BLKb of the memory blocks BLK1 to BLKz of FIG. 3 according to an embodiment of the present disclosure.

FIG. 5 is a circuit diagram illustrating another example a memory block BLKb of the memory blocks BLK1 to BLKz of FIG. 3 according to an embodiment of the present disclosure.

Referring to FIG. 5, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less dummy memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
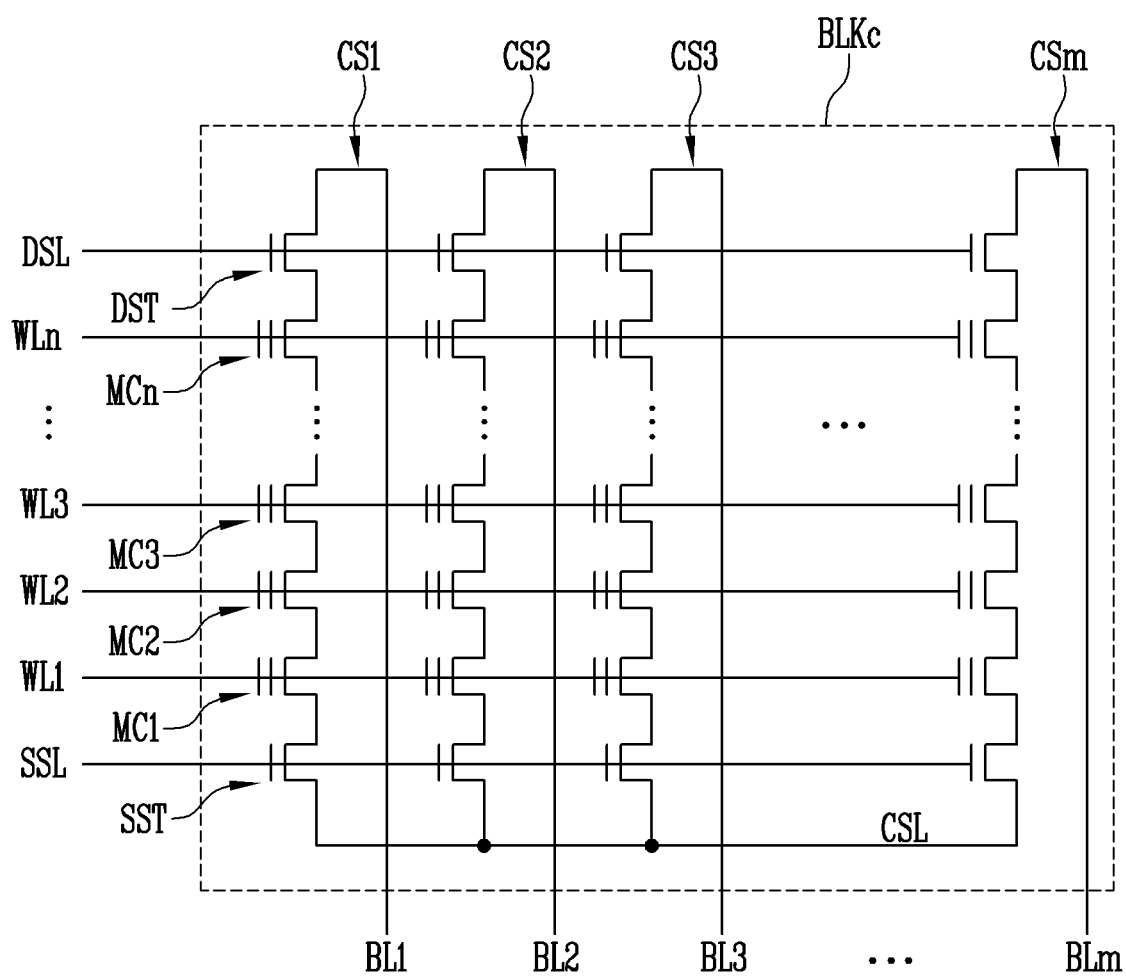
FIG. 6 is a circuit diagram illustrating a memory block BLKc of the memory blocks BLK1 to BLKz included in a memory cell array 110 of FIG. 2 according to an embodiment of the present disclosure.

FIG. 6 is a circuit diagram illustrating a memory block BLKc of the memory blocks BLK1 to BLKz included in the memory cell array 110 of FIG. 2 according to an embodiment of the present disclosure.

Referring to FIG. 6, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 7:
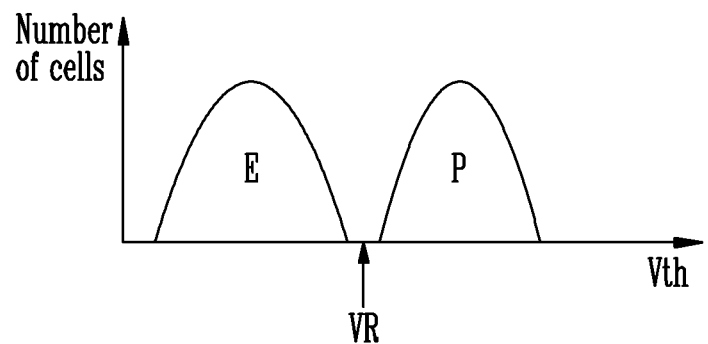
FIG. 7 is a graph illustrating a threshold voltage distribution of a single-level cell (SLC) according to an embodiment of the present disclosure.

FIG. 7 is a graph illustrating a threshold voltage distribution of the SLC according to an embodiment of the present disclosure.

Referring to FIG. 7, the threshold voltage distribution (Vth) of the SLCs immediately after the program operation is completed is shown. As shown in FIG. 7, immediately after the program operation is completed, a read margin between the threshold voltage distribution states of the memory cells, that is, an erase state E and a program state P is sufficiently formed. Accordingly, when the read operation is performed using a read voltage VR, reading data without an error is possible.

However, when the threshold voltage distribution of the memory cells is deteriorated after a program, a plurality of error bits may be included in the data read by the read voltage VR. As described above, when the data read from the semiconductor memory device 100 includes an error bit (or a fail bit) exceeding an error correction capability of the error correction block 230, the read controller 210 may control the read voltage.

For convenience of discussion, hereinafter, a method of operating a controller for controlling the read operation of the semiconductor memory device including the SLC is described. However, the present disclosure is not limited to the SLC. The present disclosure is also applicable to the MLC, the TLC, and the QLC. In addition, the present disclosure is also applicable to a memory cell that stores data of five or more bits.

Figure 8:
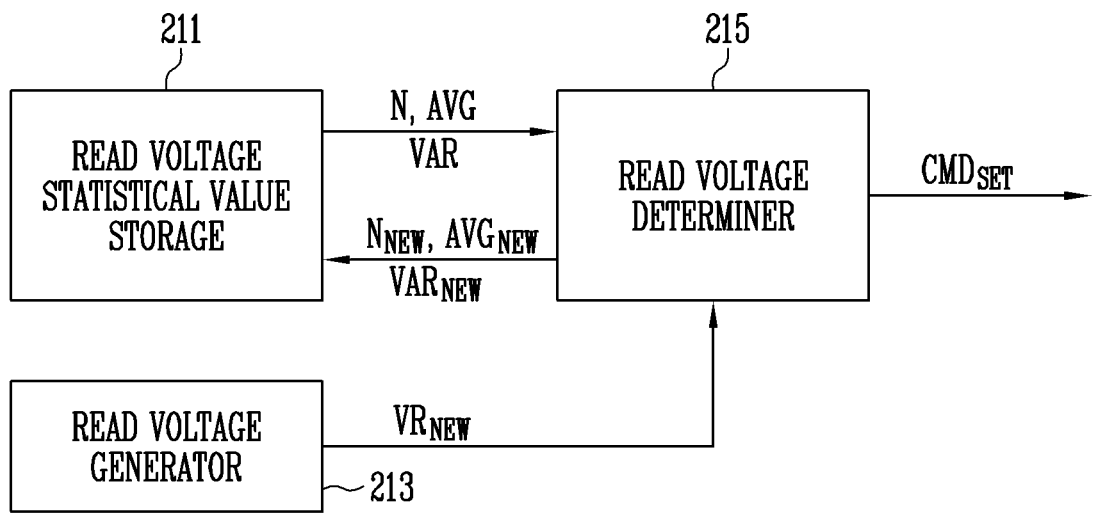
FIG. 8 is a block diagram illustrating an example of a read controller 210 shown in FIG. 1 according to an embodiment of the present disclosure.

FIG. 8 is a block diagram illustrating an example of the read controller 210 shown in FIG. 1 according to an embodiment of the present disclosure.

Referring to FIG. 8, the read controller 210 may include a read voltage statistical value storage 211, a read voltage generator 213, and a read voltage determiner 215.

The read voltage statistical value storage 211 stores a statistical value of previous read voltages that are previously generated. Error correction is successful on data that are read according to the previous read voltages. For example, the read voltage statistical value storage 211 may store a number N of times that the previous read voltages are generated (that is, the number N of the previous read voltages), an average read voltage AVG of the previous read voltages, and a variance VAR of the previous read voltages. The read voltage statistical value storage 211 may transmit, to the read voltage determiner 215, the number N of times that the previous read voltages are generated, the average read voltage AVG of the previous read voltages, and the variance VAR of the previous read voltages.

The read voltage generator 213 may generate a new read voltage $VR_{NEW}$. More specifically, when the read data received from the semiconductor memory device 100 includes an error bit (or a fail bit) exceeding the error correction capability of the error correction block 230, the read voltage generator 213 generates the new read voltage $VR_{NEW}$. The read voltage generator 213 may transmit the generated new read voltage $VR_{NEW}$ to the read voltage determiner 215.

The read voltage generator 213 may generate the new read voltage $VR_{NEW}$ by various methods according to design and necessity. In an embodiment, the read voltage generator 213 may generate the new read voltage $VR_{NEW}$ from a read retry table. An embodiment of the read voltage generator 213 that generates the new read voltage $VR_{NEW}$ from the read retry table is described later with reference to FIGS. 14 and 15. However, the read voltage generator 213 according to the present disclosure is not limited thereto, and may generate the new read voltage $VR_{NEW}$ according to various known methods.

The read voltage determiner 215 may receive the number N of times that the previous read voltages are generated, the average read voltage AVG of the previous read voltages, and the variance VAR of the previous read voltages from the read voltage statistical value storage 211. The read voltage determiner 215 may receive the new read voltage $VR_{NEW}$ from the read voltage generator 213.

The read voltage determiner 215 may determine whether the new read voltage $VR_{NEW}$ received from the read voltage generator 213 corresponds to an outlier based on the average read voltage AVG and the variance VAR of the previous read voltages. When the new read voltage $VR_{NEW}$ corresponds to the outlier may mean that the new read voltage $VR_{NEW}$ is not within an allowable range depending on the previous read voltages. When the new read voltage $VR_{NEW}$ does not correspond to the outlier may mean that the new read voltage $VR_{NEW}$ is within the allowable range. As an example, the read voltage determiner 215 may calculate a standard deviation (a) of the previous read voltages from the variance VAR of the previous read voltages. The read voltage determiner 215 may determine whether the new read voltage $VR_{NEW}$ corresponds to the outlier based on the average read voltage AVG and the standard deviation (a) of previous read voltages. An embodiment in which it is determined whether the new read voltage $VR_{NEW}$ corresponds to the outlier based on the average read voltage AVG of previous read voltages and the standard deviation (a) of previous read voltages is described later with reference to FIG. 11.

When the new read voltage $VR_{NEW}$ does not correspond to the outlier, the read voltage determiner 215 may control the semiconductor memory device 100 to perform a next read operation of re-reading the data using the new read voltage $VR_{NEW}$. To this end, the read voltage determiner 215 may transmit a setting command $CMD_{SET}$ for changing the read voltage to the new read voltage $VR_{NEW}$ to the semiconductor memory device 100.

The re-read data obtained by the next read operation according to the new read voltage $VR_{NEW}$ may be transmitted from the semiconductor memory device 100 to the controller 200. When the error correction operation on the re-read data is successful, the read voltage determiner 215 calculates a new average read voltage $AVG_{NEW}$ and a new variance $VAR_{NEW}$ based on the new read voltage $VR_{NEW}$. The read voltage determiner 215 generates a value, which is obtained by adding "1" to the number N of times that the previous read voltages are generated, as a new number $N_{NEW}$ of times that the read voltage is generated. The read voltage determiner 215 transmits the new number $N_{NEW}$ of times that the read voltage is generated, the new average read voltage $AVG_{NEW}$, and the new variance $VAR_{NEW}$ to the read voltage statistical value storage 211. The read voltage statistical value storage 211 removes the previously stored statistical values N, AVG, and VAR, and stores new statistical values $N_{NEW}$, $AVG_{NEW}$, and $VAR_{NEW}$.

When the new read voltage $VR_{NEW}$ corresponds to the outlier, the read voltage determiner 215 may not apply the new read voltage $VR_{NEW}$ to the semiconductor memory device 100. Instead, the read voltage determiner 215 may control the semiconductor memory device 100 to perform the next read operation using the existing average read voltage AVG. To this end, the read voltage determiner 215 may transmit a setting command $CMD_{SET}$ for changing the read voltage to the average read voltage AVG to the semiconductor memory device 100.

The re-read data obtained by the next read operation according to the average read voltage AVG may be transmitted from the semiconductor memory device 100 to the controller 200. When the error correction operation on the re-read data is successful, the read voltage determiner 215 calculates the new average read voltage $AVG_{NEW}$ and the new variance VAR NEW based on the average read voltage AVG. In this case, the new average read voltage $AVG_{NEW}$ may be the same as the existing average read voltage AVG. The read voltage determiner 215 generates the value, which is obtained by adding "1" to the number N of times that the previous read voltages are generated, as the new number $N_{NEW}$ of times that the read voltage is generated. The read voltage determiner 215 transmits, to the read voltage statistical value storage 211, the new number N NEW of times that the read voltage is generated, the new average read voltage $AVG_{NEW}$, and the new variance $VAR_{NEW}$. The read voltage statistical value storage 211 removes the previously stored statistical values N, AVG, and VAR, and stores the new statistical values $N_{NEW}$, $AVG_{NEW}$, and $VAR_{NEW}$.

According to an embodiment of the present disclosure, the read voltage statistical value storage 211 stores only three statistical values, that is, the number N of times that the previous read voltages are generated, the average read voltage AVG of the previous read voltages, and the variance VAR of the previous read voltages. Therefore, a storage space in the controller 200 required for determining whether the new read voltage $VR_{NEW}$ corresponds to the outlier may be saved. In a typical case, the controller 200 calculates an average and a variance of the read voltages in a state in which all previously used read voltages are stored. In this case, when the number of times the read voltage is changed increases, the storage space in the controller 200 for storing them increases. In addition, when the number of times the read voltage is changed increases, the number of input variables required to calculate the average or the variance of the read voltages increases, which increases a time required to determine whether the new read voltage corresponds to the outlier.

According to the present disclosure, there is no need for the controller 200 to store all previously used read voltages. Instead, only three statistical values, that is, the number N of times that the previous read voltages are generated, the average read voltage AVG of the previous read voltages, and the variance VAR of the previous read voltages are stored, and it is determined whether the new read voltage $VR_{NEW}$ corresponds to the outlier based on these statistical values. Therefore, even though the number of times that the read voltage is changed increases, the storage space in the controller 200 for storing these statistical values is maintained at a minimum. In addition, even though the number of times that the read voltage is changed increases, the number of input variables required to calculate the average or the variance of the read voltages is maintained constant. Accordingly, the time required to determine whether the new read voltage corresponds to the outlier is also maintained at a minimum.

Hereinafter, a method of operating a controller according to an embodiment of the present disclosure is described in detail with reference to FIG. 9.

Figure 9:
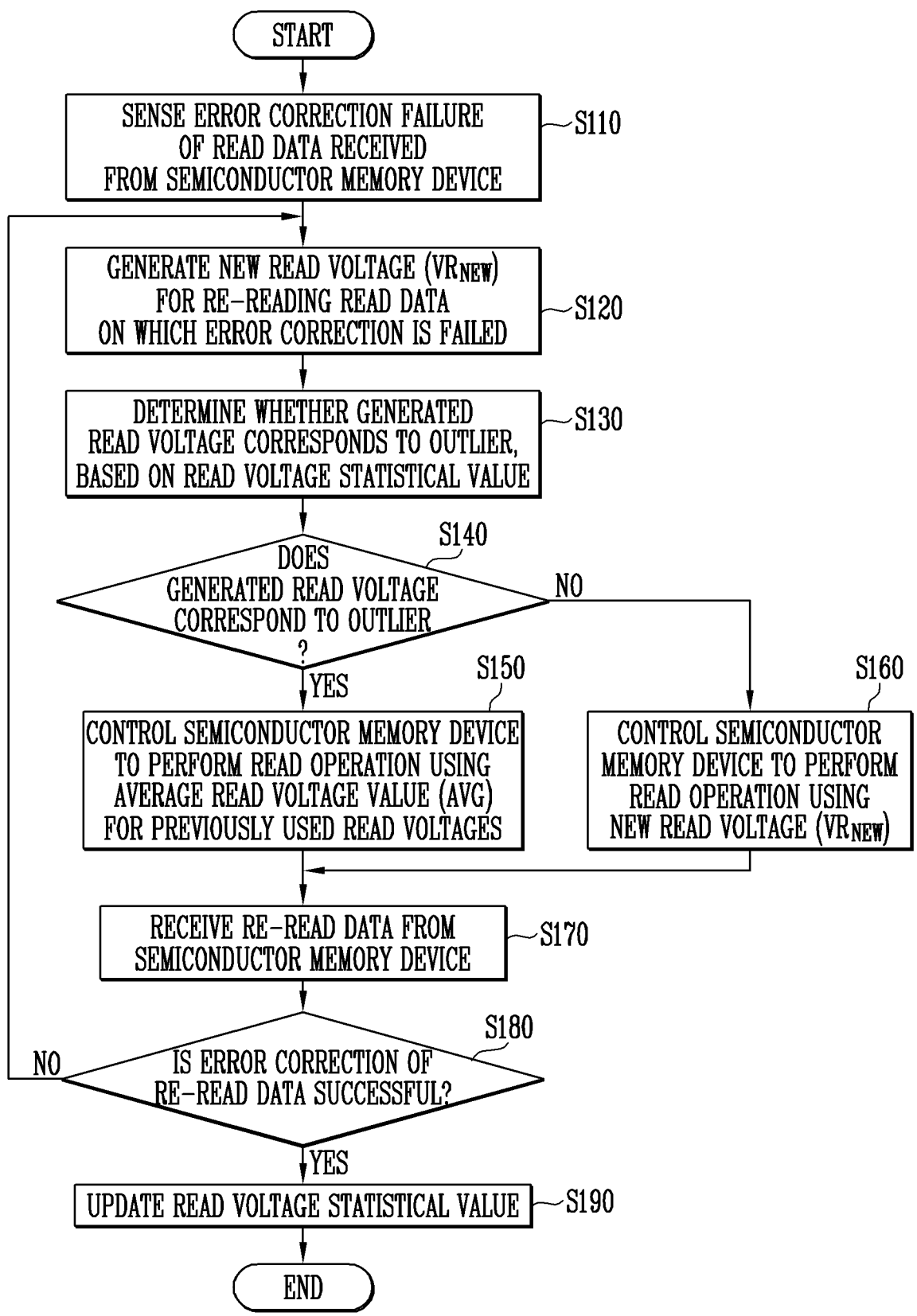
FIG. 9 is a flowchart illustrating a method of operating a controller 200 according to an embodiment of the present disclosure.

FIG. 9 is a flowchart illustrating the method of operating the controller 200 according to an embodiment of the present disclosure.

Referring to FIG. 9, an error correction failure of the data read from the semiconductor memory device 100 is sensed by the method of operating the controller 200 according to an embodiment of the present disclosure (S110). Before operation S110, transmitting the read command $CMD_{READ}$ to the semiconductor memory device and receiving the read data corresponding to the read command $CMD_{READ}$ from the semiconductor memory device may be performed.

When the read data includes the error bit (or fail bit) exceeding the error correction capability of the error correction block 230 as a result of the error correction operation on the received read data performed by the error correction block 230, the read voltage generator 213 may generate the new read voltage $VR_{NEW}$ (S120).

Thereafter, the read voltage determiner 215 determines whether the generated new read voltage VR NEW corresponds to the outlier based on the read voltage statistical value (S130). In an embodiment, the read voltage statistical value may include the average read voltage AVG of the previous read voltages and the variance VAR of the previous read voltages. As described above, the read voltage determiner 215 may calculate the standard deviation (a) of the previous read voltages from the variance VAR of the previous read voltages, and determine whether the new read voltage VR NEW corresponds to the outlier based on the average read voltage AVG and the standard deviation (a) of the previous read voltages.

When the generated new read voltage VR NEW corresponds to the outlier (S140: Yes), the controller 200 may control the semiconductor memory device 100 to perform a next read operation of re-reading the data using the average read voltage AVG instead of the generated new read voltage $VR_{NEW}$ (S150). To this end, the read voltage determiner 215 of the controller 200 may transmit the setting command $CMD_{SET}$ for changing the read voltage to the average read voltage AVG to the semiconductor memory device 100. In addition, the controller 200 may generate the read command $CMD_{READ}$ and transmit the read command $CMD_{READ}$ to the semiconductor memory device 100.

When the generated new read voltage $VR_{NEW}$ does not correspond to the outlier (S140: No), the read voltage determiner 215 may control the semiconductor memory device 100 to perform the next read operation of re-reading the data using the new read voltage $VR_{NEW}$ (S160). To this end, the read voltage determiner 215 may transmit the setting command $CMD_{SET}$ for changing the read voltage to the new read voltage $VR_{NEW}$ to the semiconductor memory device 100. In addition, the controller 200 may generate the read command $CMD_{READ}$ and transmit the read command $CMD_{READ}$ to the semiconductor memory device 100.

Thereafter, in operation S170, the controller 200 receives the re-read data from the semiconductor memory device. The error correction block 230 may perform the error correction operation on the re-read data. When the error correction operation on the re-read data is successful (S180: Yes), the controller 200 updates the read voltage statistical value stored in the read voltage statistical value storage 211 (S190).

More specifically, when the generated new read voltage $VR_{NEW}$ corresponds to the outlier as a result of the determination of operation S140, the next read operation of re-reading the data may have been performed using the average read voltage AVG (S150). In this case, in operation S190, the read voltage determiner 215 calculates the new average read voltage $AVG_{NEW}$ and the new variance $VAR_{NEW}$ by applying the average read voltage AVG.

When the generated new read voltage $VR_{NEW}$ does not correspond to the outlier as a result of the determination of operation S140, the next read operation of re-reading the data may be performed using the new read voltage $VR_{NEW}$ (S160). In this case, in operation S190, the read voltage determiner 215 calculates the new average read voltage $AVG_{NEW}$ and the new variance $VAR_{NEW}$ by applying the new read voltage $VR_{NEW}$.

In accordance with the controller and the method of operating the same according to an embodiment of the present disclosure, a new average read voltage $AVG_{NEW}$ and the new variance $VAR_{NEW}$ may be calculated by an online algorithm in operation S190. The online algorithm refers to an algorithm that does not have all input information during a calculation operation and processes inputs while receiving the inputs sequentially. In contrast, an offline algorithm may solve a problem only by starting with all data related to the problem that is intended to be solved. An embodiment of the present disclosure in which the new average read voltage $AVG_{NEW}$ and the new variance $VAR_{NEW}$ are calculated according to the online algorithm is described later with reference to FIG. 12.

When the error correction of the re-read data is failed in operation S180, the method may return to operation 120 again to generate the new read voltage $VR_{NEW}$, and operations S120 to S170 may be repeatedly performed.

Hereinafter, determining whether the generated read voltage corresponds to the outlier based on the read voltage statistical value (S130) is described with reference to FIGS. 10 and 11.

Figure 10:
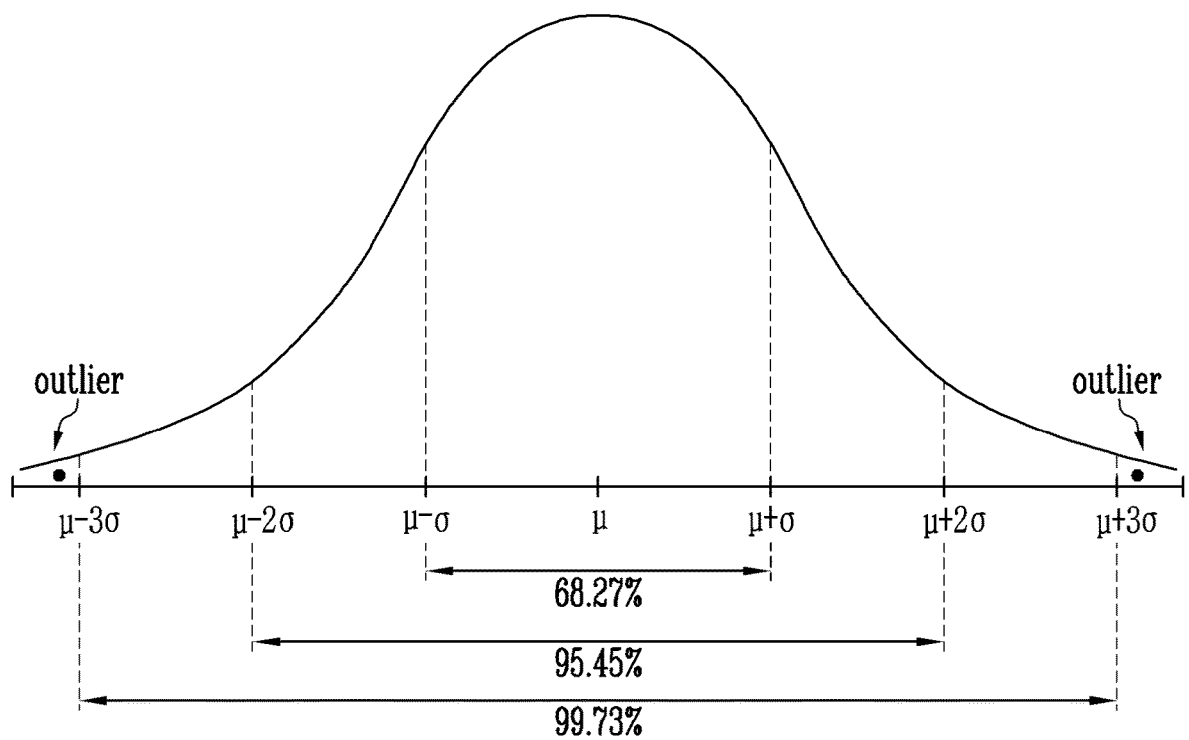
FIG. 10 is a graph illustrating a normal distribution curve according to an embodiment of the present disclosure.

FIG. 10 is a graph illustrating a normal distribution curve according to an embodiment of the present disclosure. As the number of times that the read voltages are generated increases, a distribution of the corresponding read voltages may become similar to the normal distribution curve shown in FIG. 10. Considering an average value (p) and a standard deviation (a) of the normal distribution curve, a probability that a variable belongs to a section (μ−σ, μ+σ) is 68.27%, a probability that the variable belongs to a section (μ−2σ, μ+2σ) is 95.45%, and a probability that the variable belongs to a section (μ−3σ, μ+3σ) is 99.73%.

According to necessity of design, a condition of a variable corresponding to the outlier may be variously determined. FIG. 10 illustrates an embodiment in which the variable is determined as the outlier when the variable is less than "μ−3σ" or greater than "p+3σ". That is, 99.73% of the generated read voltage $VR_{NEW}$ may be determined as a normal read voltage not the outlier, and the remaining 0.27% may be determined as the outlier. However, this is only an example, and various criteria may be applied according to necessity. For example, in another embodiment, when the variable is less than "μ−2.5σ" or greater than "μ+2.5σ", the variable may be determined as the outlier.

Figure 11:
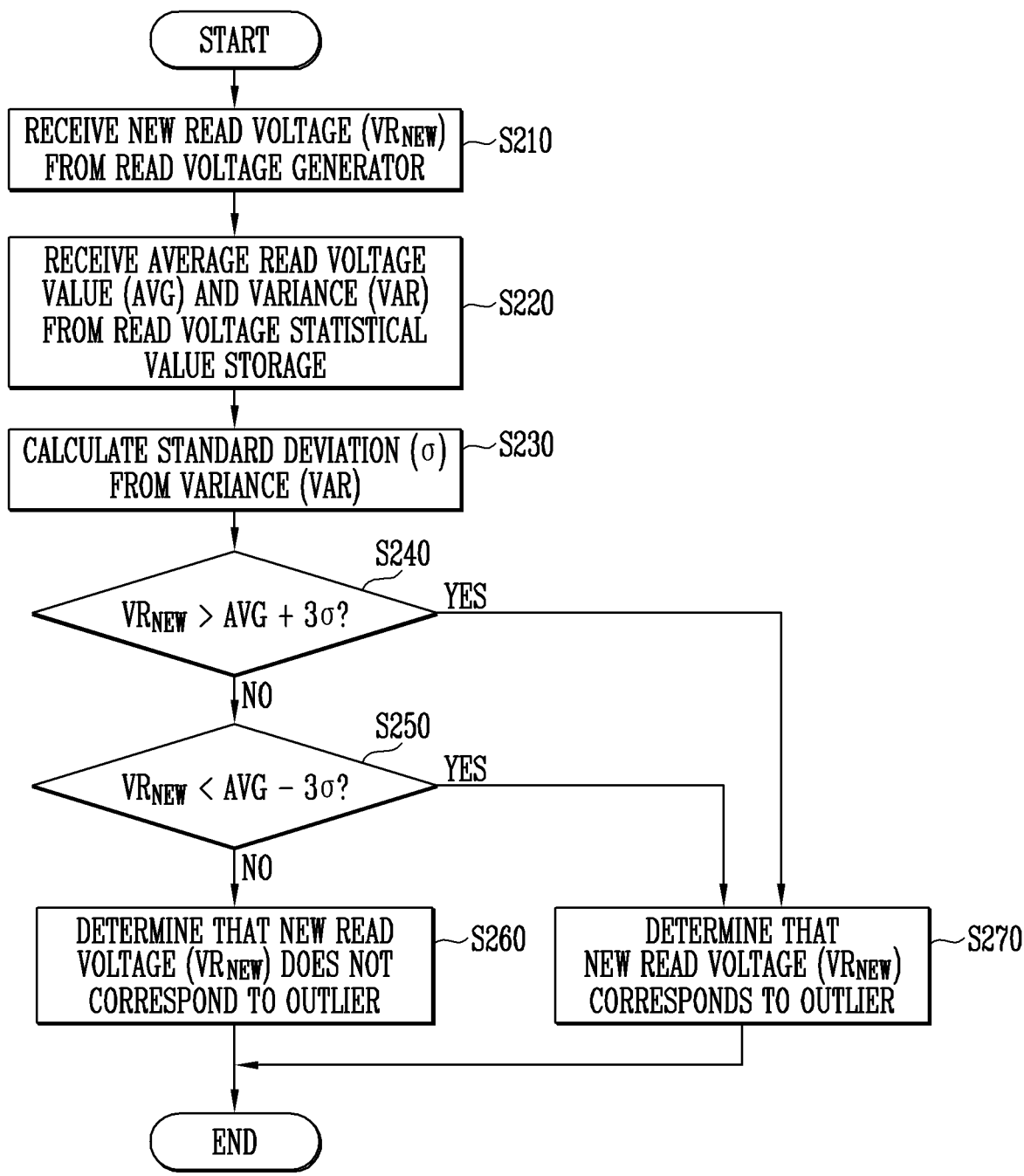
FIG. 11 is a flowchart illustrating operation S130 according to an embodiment of the present disclosure.

FIG. 11 is a flowchart illustrating an example of operation S130 according to an embodiment of the present disclosure. More specifically, in FIG. 11, an embodiment in which the new read voltage $VR_{NEW}$ is determined as the outlier when the new read voltage $VR_{NEW}$ is less than "μ−3σ" or greater than "μ+3σ" when considering the statistical value of the existing read voltages as shown in FIG. 10, is shown.

Referring to FIG. 11, operation S130 may be performed by the read voltage determiner 215 shown in FIG. 8. The read voltage determiner 215 receives the new read voltage $VR_{NEW}$ from the read voltage generator 213 (S210). The read voltage determiner 215 receives the average read voltage AVG and the variance VAR from the read voltage statistical value storage 211 for the previous read voltages (S220).

The read voltage determiner 215 calculates the standard deviation (σ) from the received variance VAR (S230). More specifically, the read voltage determiner 215 may calculate the standard deviation (σ) by calculating a square root of the variance VAR.

In operation (S240), it is determined whether the new read voltage $VR_{NEW}$ is greater than "AVG+3σ". Here, the average read voltage AVG may be substantially the same as the average value (μ) of the normal distribution curve shown in FIG. 10. When the new read voltage $VR_{NEW}$ is greater than "AVG+3σ" (S240: Yes), it is determined that the new read voltage $VR_{NEW}$ corresponds to the outlier (S270). That is, it is determined that the new read voltage $VR_{NEW}$ does not belong to the allowable range.

When the new read voltage $VR_{NEW}$ is less than or equal to "AVG+3σ" (S240: No), it is determined whether the new read voltage $VR_{NEW}$ is less than "AVG−3σ" (S250). When the new read voltage $VR_{NEW}$ is less than "AVG−3σ" (S250: Yes), it is determined that the new read voltage $VR_{NEW}$ corresponds to the outlier (S270). That is, it is determined that the new read voltage $VR_{NEW}$ does not belong to the allowable range.

When the new read voltage $VR_{NEW}$ is greater than or equal to "AVG−3σ" (S250: No), the new read voltage $VR_{NEW}$ belongs to the section (μ−3σ, μ+3σ) of FIG. 10. Therefore, in this case, it is determined that the new read voltage $VR_{NEW}$ does not correspond to the outlier (S260). That is, it is determined that the new read voltage $VR_{NEW}$ belongs to the allowable range.

As shown in FIG. 11, in accordance with the controller and the method of operating the same according to embodiments of the present disclosure, it may be determined whether the new read voltage $VR_{NEW}$ corresponds to the outlier based on two existing statistical values, that is, the average read voltage AVG of the previous read voltages and the variance VAR of the previous read voltages. Accordingly, even though the number of times when the read voltage is changed increases, the number of input variables required to calculate the average or the variance of the read voltages is maintained constant. As a result, the time required to determine whether the new read voltage corresponds to the outlier, that is, whether the new read voltage belongs to the allowable range, is also maintained as a minimum.

FIG. 12 is a flowchart illustrating an example of operation S190 according to an embodiment of the present disclosure. More specifically, the update operation performed in operation S190 when the error correction of the re-read data is successful (S180: Yes) as a result that the generated new read voltage $VR_{NEW}$ does not correspond to the outlier in operation S140 of FIG. 9, and thus the next read operation of re-reading the data is performed using the new read voltage $VR_{NEW}$ (S160), is described.

Referring to FIG. 12, operation S190 may be performed by the read voltage determiner 215 shown in FIG. 8. The read voltage determiner 215 receives the number N of times that the previous read voltages are generated from the read voltage statistical value storage 211 (S310). Briefly, the number of read voltages according to which the error correction is successful on the previously read data among the read voltages used in the read operation may correspond to a number N of times of generating the read voltages. The number N of times of generating the read voltages is described later with reference to a table shown in FIGS. 13A and 13B.

In a subsequent operation S330, the read voltage determiner 215 generates the new average read voltage $AVG_{NEW}$ based on the average read voltage AVG, the number N of times of generating the read voltages, and the new read voltage $VR_{NEW}$. In operation S330, the new average read voltage $AVG_{NEW}$ may be generated based on Equation 1 below.

$$AVG_{NEW} = \frac{N \cdot AVG + VR_{NEW}}{N_{NEW}} \qquad \text{[Equation 1]}$$

Here, the new number $N_{NEW}$ of times of generating the read voltages may be obtained by adding 1 to the existing number N of times of generating the read voltages. That is, when Equation 1 is arranged, Equation 2 is obtained.

$$AVG_{NEW} = \frac{N \cdot AVG + VR_{NEW}}{N + 1} \qquad \text{[Equation 2]}$$

That is, instead of all previously used read voltages, the new average read voltage $AVG_{NEW}$ may be generated based on the average read voltage AVG, the number N of times of generating the read voltages, and the new read voltage $VR_{NEW}$.

Thereafter, in operation S350, the read voltage determiner 215 may generate the new variance $VAR_{NEW}$ based on the average read voltage AVG, the variance VAR, the new read voltage $VR_{NEW}$, the number N of times of generating the read voltages, and the new average read voltage $AVG_{NEW}$. In operation S350, the read voltage determiner 215 may generate the new variance $VAR_{NEW}$ based on Welford's algorithm. The Wellford's algorithm is included in the online algorithm and does not require all existing sample values to update a variance according to an addition of a sample value. Instead, the Wellford's algorithm is an algorithm that may quickly calculate a variance value only with an existing variance, an existing average value, an updated average value, and the number of samples. According to the Wellford's algorithm, the new variance $VAR_{NEW}$ according to the addition of the new read voltage $VR_{NEW}$ may be calculated based on Equation 3 below.

$$VAR_{NEW} = \frac{VAR \cdot (N-1) + (VR_{NEW} - AVC) \cdot (VR_{NEW} - AVG_{NEW})}{N} \quad \text{[Equation 3]}$$

Referring to Equation 3 above, in order to calculate the new variance $VAR_{NEW}$ using the Wellford's algorithm, only the existing variance VAR, the existing average read voltage AVG, the new average read voltage $AVG_{NEW}$, the number N of times of generating the read voltages, and the new read voltage $VR_{NEW}$ are required. Among them, the existing variance VAR, the existing average read voltage AVG, and the number N of times of generating the read voltages are the statistical values stored in the read voltage statistical value storage 211, the new average read voltage $AVG_{NEW}$ is calculated by operation S330, and the new read voltage $VR_{NEW}$ is a value transmitted from the read voltage generator 213. Therefore, without necessity for maintaining all previously used read voltages, the new average read voltage $AVG_{NEW}$ and the new variance $VAR_{NEW}$ according to an application of the new read voltage $VR_{NEW}$ may be generated online by maintaining only the existing variance VAR, the existing average read voltage AVG, and the number N of times of generating the read voltages in the read voltage statistical value storage 211.

FIGS. 13A and 13B are tables illustrating a method of operating a controller according to an embodiment of the present disclosure. For convenience of description, a number included in the tables of FIGS. 13A and 13B is indicated only to two decimal places. A unit of the read voltage VR and the average read voltage AVG among the numbers shown in FIGS. 13A and 13B is volts.

In operation S370, the new read voltage generation number of times ($N_{NEW}$), the new average read voltage value ($AVG_{NEW}$), and the new variance ($VAR_{NEW}$) are transmitted to the read voltage statistical value storage 211.

Referring to FIG. 13A first, the read voltage generated by repeatedly using operations shown in FIG. 9 and the statistical value thereof are shown. The table shown in FIG. 13A includes all seven columns. A first column indicates the number N of times of generating the read voltages, a second column indicates the generated read voltage VR, a third column indicates the average read voltage AVG of the read voltages generated up to a corresponding row, and a fourth column indicates the variance VAR of the read voltages generated up to a corresponding row. A fifth column indicates the "$\mu - 3\sigma$" value, which is a lower limit of an outlier determination condition, calculated through the average read voltage AVG and the variance VAR of a corresponding row, and a sixth column indicates "$\mu + 3\sigma$" value, which is an upper limit of the outlier determination condition. Finally, a seventh column indicates whether the read voltage VR added to a corresponding row corresponds to the outlier according to the upper limit and the lower limit of the outlier determination condition of a previous row.

Referring to a first row, a value of an initially used read voltage VR is "1". The number N of times of generating the read voltages corresponding to the initially used read voltage is also "1". The average read voltage AVG becomes 1. Since there are no other read voltages yet, the variance VAR, "$\mu - 3\sigma$" and "$\mu + 3\sigma$" may not be calculated. Therefore, it is determined that "1", which is the read voltage VR value of the first row, is not the outlier.

Referring to a second row, the number N of times of generating the read voltages becomes "2". When the newly generated read voltage VR is "4", the average read voltage AVG of the read voltage from the first row to the second row becomes 2.5. The variance VAR of the second row becomes "4.5" through a calculation of "$((2.5-1)^2+(2.5-4)^2)/1$". Based on the second row, "$\mu - 3\sigma$" and "$\mu + 3\sigma$" become "−3.86" and "8.86", respectively.

Referring to a third row, the new read voltage VR is 2. Referring to the "$\mu - 3\sigma$" and "$\mu + 3\sigma$" value in the second row, since 2 is greater than −3.86 and less than 8.86, 2 does not correspond to the outlier. Meanwhile, the Wellford's algorithm may be used when calculating the variance from the third row. First, the average read voltage AVG corresponding to the third row becomes "2.33" when "$((2*2.5)+2)/3$" is calculated according to Equation 1 or Equation 2. The variance VAR corresponding to the third row becomes "2.33" when "$(4.5*(2-1)+(2-2.5)*(2-2.33))/2$" is calculated according to Equation 3. Based on the third row, "$\mu - 3\sigma$" and "$\mu + 3\sigma$" become "−2.25" and "6.92", respectively.

Referring to a fourth row, the new read voltage VR is 4. Referring to the "$\mu - 3\sigma$" and "$\mu + 3\sigma$" value in the third row, since 4 is greater than −2.25 and less than 6.92, 4 does not correspond to the outlier. The average read voltage AVG corresponding to the fourth row becomes "2.75" when "$((3*2.33)+4)/4$" is calculated according to Equation 1 or Equation 2. The variance VAR corresponding to the fourth row is "2.25" when "$(2.33*(3-1)+(4-2.33)*(4-2.75))/3$" is calculated according to Equation 3. Based on the fourth row, "$\mu - 3\sigma$" and "$\mu + 3\sigma$" become "−1.75" and "7.25", respectively.

In such a method, whenever the read voltage VR is generated, it is determined whether the read voltage VR is the outlier, and the average read voltage AVG and the variance VAR may be calculated online. Until a tenth read voltage is generated, all generated read voltages may not correspond to the outlier.

Referring to a last eleventh row of the table shown in FIG. 13A, the new read voltage is "8". Referring to "$\mu - 3\sigma$" and "$\mu + 3\sigma$" of a previous seventh row, "$\mu - 3\sigma$" and "$\mu + 3\sigma$" are "−1.47" and "7.67", respectively. That is, since "8" which is the new read voltage is greater than "7.67" which is "$\mu + 3\sigma$", the new read voltage corresponds to the outlier. Accordingly, the new read voltage is not used in the next read operation of re-reading the data.

Referring to FIG. 13B, read voltage selection after "8" which is an eleventh new read voltage corresponds to the outlier according to FIG. 13A, is shown. First to tenth rows of the table shown in FIG. 13B are the same as those shown in the table of FIG. 13A. However, as described with reference to FIG. 13A, since "8" which is the new read voltage corresponds to the outlier, the next read operation is performed using the average read voltage AVG of the read voltages previously used according to operation S150 of FIG. 9. Based on the eleventh row, since the average read voltage AVG corresponding to the previous tenth row is "3.10", the next read operation is performed using the average read voltage AVG, i.e., "3.10". When the error correction of the re-read data is successful as a result of performing the next read operation using "3.10" which is the average read voltage AVG (S180), the read voltage statistical value is updated using the average read voltage AVG, i.e., "3.10" (S190). Accordingly, the average read voltage AVG corresponding to the eleventh row becomes 3.1 which is the same as the tenth row. According to Wellford's algorithm, when the variance of the eleventh row is calculated according to Equation 3, the variance becomes "2.09" according to "(2.32*(10−1)+(3.1−3.1)*(3.1−3.1))/10".

Figures 14, 15:
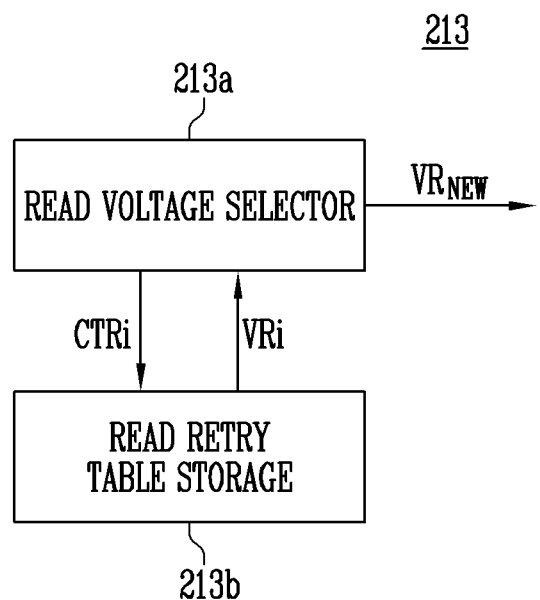
FIG. 14 is a block diagram illustrating a read voltage generator 213 shown in FIG. 8 according to an embodiment of the present disclosure.
FIG. 15 is a table illustrating a read retry table according to an embodiment of the present disclosure.

FIG. 14 is a block diagram illustrating an example of the read voltage generator 213 shown in FIG. 8 according to an embodiment of the present disclosure. FIG. 15 is a table illustrating an exemplary embodiment of the read retry table RRT according to an embodiment of the present disclosure. Hereinafter, an operation of the read voltage generator 213 is described with reference to FIGS. 14 and 15 together.

Referring to FIG. 14, the read voltage generator 213 may include a read voltage selector 213a and a read retry table storage 213b. The read voltage generator 213a may generate a control signal CTRi that controls the read retry table storage 213b. The read retry table storage 213b may store the read retry table RRT as shown in FIG. 15. The read retry table storage 213b may transmit a read voltage VRi included in the read retry table RRT to the read voltage selector 213a, in response to the control signal CTRi received from the read voltage selector 213a.

The read voltage selector 213a may control the read retry table storage 213b to output the read voltage VRi corresponding to an i-th row of the read retry table RRT while increasing i, which is a natural number, by 1, whenever the error correction failure for the read data is repeated. For example, when the error correction failure for the read data occurs for the first time, the read voltage selector 213a may generate a first control signal CTR1 and transmit the first control signal CTR1 to the read retry table storage 213b so that a read voltage corresponding to a first row of the read retry table RRT is output. The read retry table storage 213b may transmit a first read voltage VR1 to the read voltage selector 213a in response to the first control signal CTR1. The read voltage selector 213a may output the received first read voltage VR1 as the new read voltage $VR_{NEW}$.

Thereafter, when the error correction failure for the read data occurs for the second time, the read voltage selector 213a may generate a second control signal CTR2 and transmit the second control signal CTR2 to the read retry table storage 213b so that a read voltage corresponding to a second row of the read retry table RRT is output. The read retry table storage 213b may transmit a second read voltage VR2 to the read voltage selector 213a in response to the second control signal CTR2. The read voltage selector 213a may output the received second read voltage VR2 as the new read voltage $VR_{NEW}$.

In such a method, whenever the error correction failure for the read data is repeated, the read voltage generator 213 may sequentially output the read voltages included in the read retry table RRT as the new read voltage $VR_{NEW}$.

However, the embodiment shown in FIGS. 14 and 15 is an example, and the read voltage generator 213 may generate the new read voltage $VR_{NEW}$ according to various methods as described above.

Figure 16:
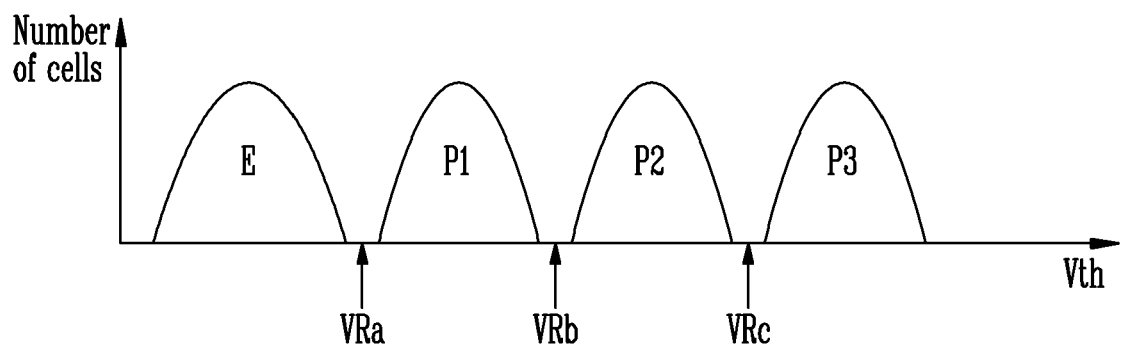
FIG. 16 is a graph illustrating a threshold voltage distribution of a multi-level cell (MLC) according to an embodiment of the present disclosure.

FIG. 16 is a graph illustrating a threshold voltage distribution of the MLC according to an embodiment of the present disclosure.

Referring to FIG. 16, the threshold voltage distribution of the MLCs immediately after the program operation is completed is shown. As shown in FIG. 16, immediately after the program operation is completed, a read margin between threshold voltage distribution states of the memory cells, that is, an erase state E and first to third program states P1 to P3 is sufficiently formed. Accordingly, when the read operation is performed using a-th to c-th read voltages VRa to VRc, data may be read without an error.

However, when the threshold voltage distribution of the memory cells is deteriorated after the program, a plurality of error bits may be included in the data read by the a-th to c-th read voltages VRa to VRc. As described above, when the data read from the semiconductor memory device 100 includes the error bit (or fail bit) exceeding the error correction capability of the error correction block 230, the read controller 210 may control the read voltage.

A method of operating a controller for controlling the read operation of the semiconductor memory device including the SLC is described with reference to FIGS. 7 to 15. However, the present disclosure is not limited to the SLC, and is applicable to each of three read voltages used in the read operation of the MLC, that is, the a-th to c-th read voltages VRa to VRc as shown in FIG. 16. The present disclosure is also applicable to the TLC and the QLC. In addition, the present disclosure is also applicable to the memory cell that stores data of 5 bits or more.

Figure 17:
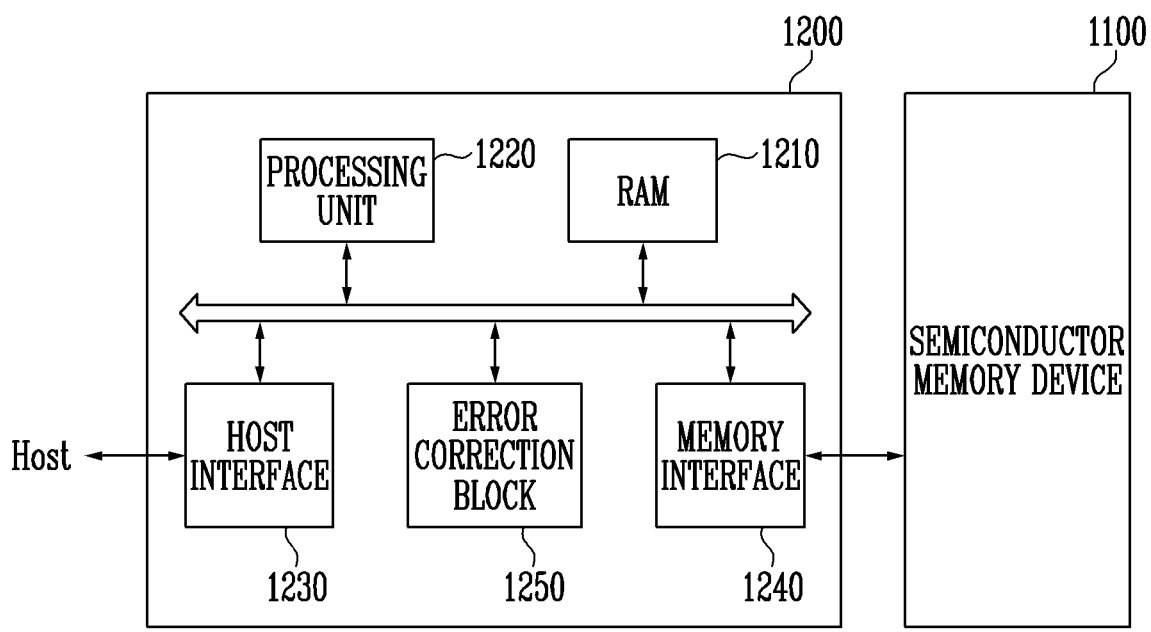
FIG. 17 is a block diagram illustrating a memory system including the controller of FIG. 1 according to an embodiment of the present disclosure.

FIG. 17 is a block diagram illustrating a memory system including the controller of FIG. 1 according to an embodiment of the present disclosure.

Referring to FIG. 17, the memory system 1005 includes the semiconductor memory device 1100 and the controller 1200. The semiconductor memory device 1100 may be the semiconductor memory device described with reference to FIG. 2. Hereinafter, a repetitive description is omitted.

The controller 1200 is connected to a host Host and the semiconductor memory device 1100. The controller 1200 is configured to access the semiconductor memory device 1100 in response to a request from the host Host. For example, the controller 1200 is configured to control read, write, erase, and background operations of the semiconductor memory device 1100. The controller 1200 is configured to provide an interface between the semiconductor memory device 1100 and the host Host. The controller 1200 is configured to drive firmware for controlling the semiconductor memory device 1100. The controller 1200 may be the controller 200 described with reference to FIG. 1.

The controller 1200 includes a random access memory (RAM) 1210, a processing unit 1220, a host interface 1230, a memory interface 1240, and an error correction block 1250. The RAM 1210 is used as at least one of an operation memory of the processor 1220, a cache memory between the semiconductor memory device 1100 and the host Host, and a buffer memory between the semiconductor memory device 1100 and the host Host. The processing unit 1220 controls an overall operation of the controller 1200.

In an embodiment, the read voltage determiner 215, which is a part of the read controller 210, may be implemented as firmware loaded into the RAM 1210 and executed by the processing unit 1220. The read voltage selector 213a, which is a part of the read voltage generator 213, may also be implemented as firmware loaded into the RAM 1210 and executed by the processing unit 1220.

The RAM 1210 of the controller 1200 may temporarily store program data provided from the host Host during the write operation. In addition, the RAM 1210 of the controller 1200 may temporarily store read data received from the semiconductor memory device 1100 during the read operation.

The RAM 1210 may configure the read voltage statistical value storage 211 shown in FIG. 8. In addition, the RAM 1210 may configure the read retry table storage 213*b* shown in FIG. 14.

The host interface 1230 includes a protocol for performing data exchange between the host Host and the controller 1200. In an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1240 interfaces with the semiconductor memory device 1100. For example, the memory interface 1240 includes a NAND interface or a NOR interface.

The error correction block 1250 is configured to detect and correct an error of data received from the semiconductor memory device 1100 using an error correcting code (ECC). The processor 1120 may control the semiconductor memory device 1100 to control a read voltage and perform a re-read according to an error detection result of the error correction block 1250. In an embodiment, the error correction block may be provided as a component of the controller 1200. The error correction block 1250 may correspond to the error correction block 230 shown in FIG. 1.

The controller 1200 and the semiconductor memory device 1100 may be integrated into one semiconductor device. In an embodiment, the controller 1200 and the semiconductor memory device 1100 may be integrated into one semiconductor device to form a memory card. For example, the controller 1200 and the semiconductor memory device 1100 may be integrated into one semiconductor device to form a memory card such as a PC card (personal computer memory card international association (PCMCIA)), a compact flash (CF) card, a smart media card (SM or SMC), a memory stick, a multimedia card (MMC, RS-MMC, or MMCmicro), an SD (SD, miniSD, microSD, or SDHC) card, and a universal flash storage (UFS).

The controller 1200 and the semiconductor memory device 1100 may be integrated into one semiconductor device to form a semiconductor drive (solid state drive (SSD)). The semiconductor drive (SSD) includes a storage device configured to store data in a semiconductor memory. When the memory system 1005 is used as the semiconductor drive (SSD), an operation speed of the host connected to the memory system 1005 is dramatically improved.

As another example, the memory system 1005 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, a Radio Frequency Identification (RFID) device, or one of various components configuring a computing system.

In an embodiment, the semiconductor memory device 1100 or the memory system may be mounted as a package of various types. For example, the semiconductor memory device 1100 or the memory system 1005 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit package (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 18:
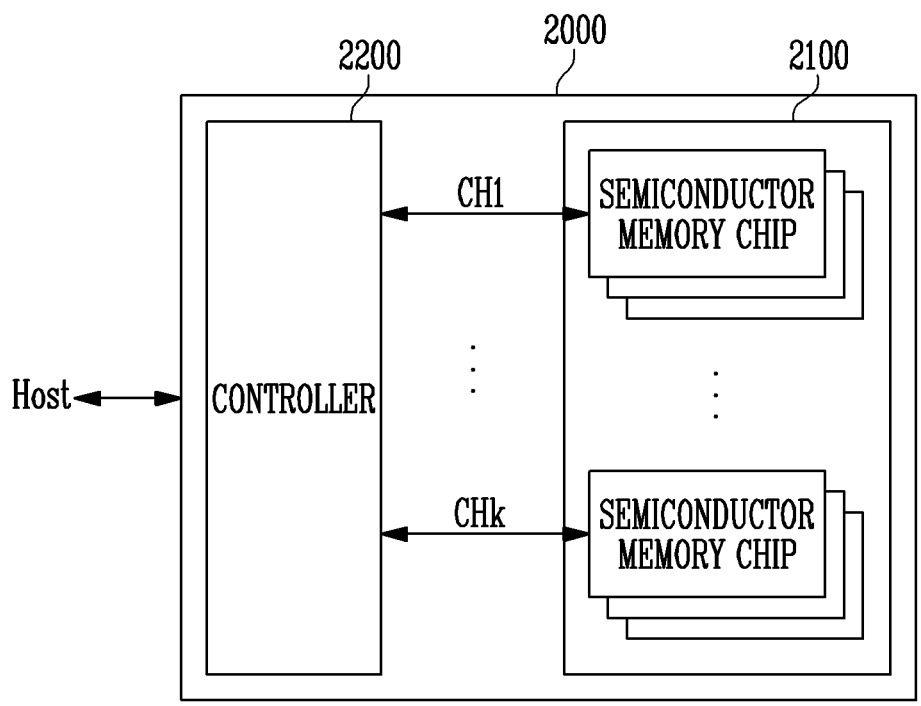
FIG. 18 is a block diagram illustrating an application example of the memory system of FIG. 17 according to an embodiment of the present disclosure.

FIG. 18 is a block diagram illustrating an application example of the memory system of FIG. 17 according to an embodiment of the present disclosure.

Referring to FIG. 18, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 18, the plurality of groups communicate with the controller 2200 through first to k-th channels CH1 to CHk, respectively. Each semiconductor memory chip is configured and is operated similarly to the semiconductor memory device 1100 described with reference to FIG. 2.

Each group is configured to communicate with the controller 2200 through one common channel. The controller 2200 is configured similarly to the controller 1200 described with reference to FIG. 17 and is configured to control the plurality of memory chips of the semiconductor memory device 2100 through the plurality of channels CH1 to CHk.

Figure 19:
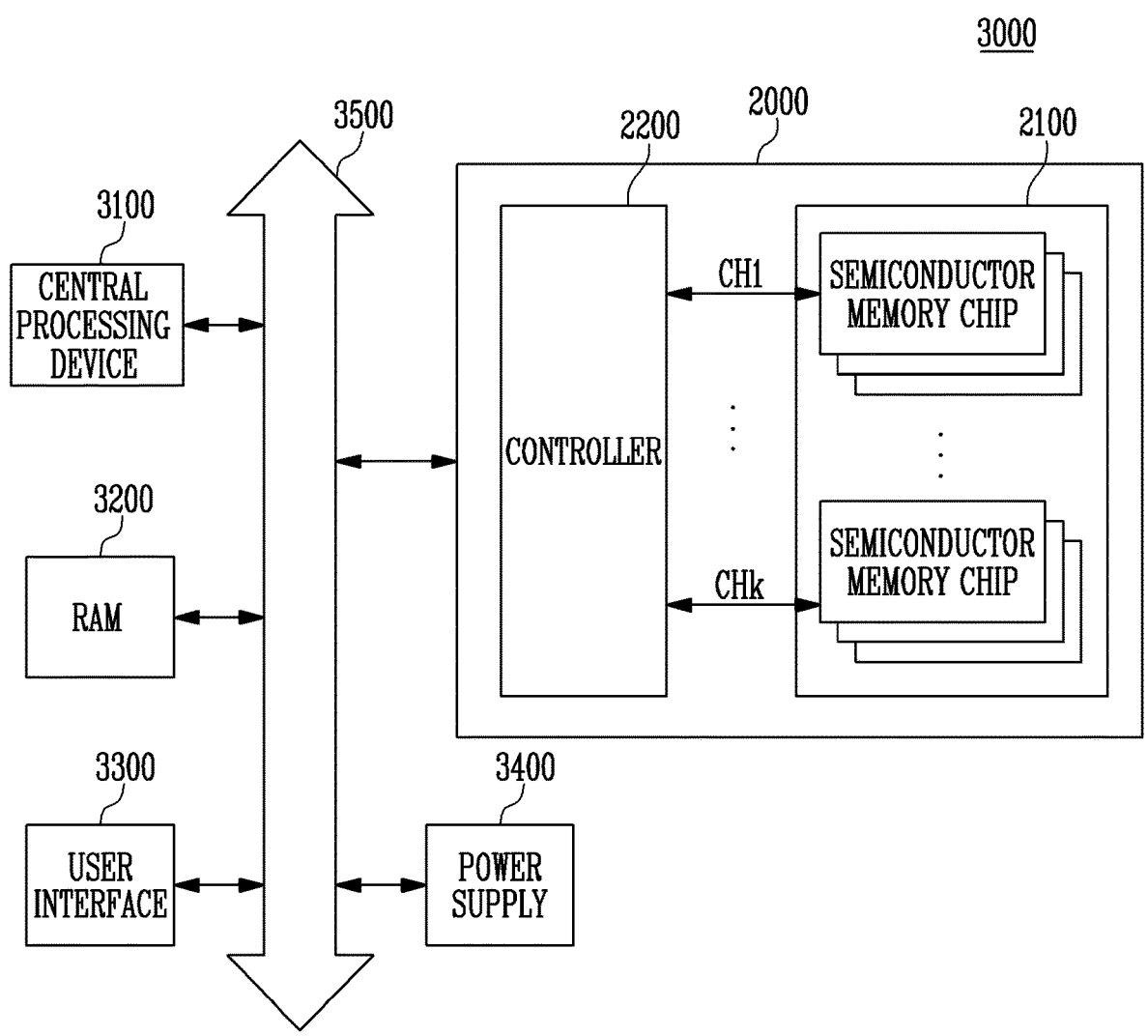
FIG. 19 is a block diagram illustrating a computing system including the memory system described with reference to FIG. 18 according to an embodiment of the present disclosure.

FIG. 19 is a block diagram illustrating a computing system including the memory system described with reference to FIG. 18 according to an embodiment of the present disclosure.

The computing system 3000 includes a central processing device 3100, a random access memory (RAM) 3200, a user interface 3300, a power supply 3400, a system bus 3500, and the memory system 2000.

The memory system 2000 is electrically connected to the central processing device 3100, the RAM 3200, the user interface 3300, and the power supply 3400 through the system bus 3500. Data provided through the user interface 3300 or processed by the central processing device 3100 is stored in the memory system 2000.

In FIG. 19, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 19, the memory system 2000 described with reference to FIG. 18 is provided. However, the memory system 2000 may be replaced with the memory system 1005 described with reference to FIG. 17. In an embodiment, the computing system 3000 may include both of the memory systems 1005 and 2000 described with reference to FIGS. 17 and 18.

The embodiments of the present disclosure disclosed in the present specification and drawings are merely provided with specific examples to easily describe the technical content of the present disclosure and to help understanding of the present disclosure, and are not intended to limit the scope of the present disclosure. It is apparent to those of ordinary skill in the art that other modified examples based on the technical spirit of the present disclosure may be implemented in addition to the embodiments disclosed herein and the following claims. Furthermore, the embodiments may be combined to form additional embodiments.

What is claimed is:

1. A method of operating a controller for controlling a semiconductor memory device including a plurality of memory cells, the method comprising:
    sensing error correction failure of data read from the semiconductor memory device;
    generating a new read voltage for re-reading the data;
    determining whether the new read voltage belongs to an allowable range, wherein the allowable range depending on a read voltage statistical value of previous successful read voltages, according to which previous read operations are successful, the read voltage statistical value includes an average and a variance of the previous successful read voltages;
    determining, based on a result of the determining whether the new read voltage belongs to the allowable range, one of the new read voltage and an average read voltage of the previously successful read voltages, according to which of the previous read operations were successful;
    controlling the semiconductor memory device to perform a next read operation of re-reading the data using the determined read voltage;
    receiving the data re-read from the semiconductor memory device through the next read operation; and
    updating, in response to error correction being successful for the re-read data received as a result of the next read operation, the read voltage statistical value with a new read voltage statistical value reflecting the determined read voltage.

2. The method of claim 1,
    wherein the determining whether the new read voltage belongs to the allowable range comprises:
    calculating a standard deviation from the variance; and
    determining whether the new read voltage belongs to a section between values 'AVG−k·σ' and 'AVG+k·σ', where 'AVG' is the average, 'σ' is the standard deviation and 'k' is a predetermined positive number.

3. The method of claim 2, wherein the determining the read voltage comprises determining the new read voltage as the read voltage to be used in the next read operation when the new read voltage is determined to belong to the section.

4. The method of claim 3, wherein the controlling the semiconductor memory device to perform the next read operation comprises controlling the semiconductor memory device to perform the next read operation using the new read voltage.

5. The method of claim 4, wherein the updating the read voltage statistical value with the new read voltage statistical value comprises:
    generating a new average based on the average of the previous successful read voltages, a number of the previous successful read voltages, and the new read voltage; and
    generating a new variance based on the average of the previous successful read voltages, the variance of the previous successful read voltages, the new read voltage, the number of the previous successful read voltages, and the new average.

6. The method of claim 5, wherein the new average is generated using equation 1:

$$AVG_{NEW} = \frac{N \cdot AVG + VR_{NEW}}{N+1}, \qquad \text{[Equation 1]}$$

where '$AVG_{NEW}$' is the new average, 'N' is the number of the previous successful read voltages, and '$VR_{NEW}$' is the new read voltage.

7. The method of claim 6, wherein the new variance is generated using equation 2:

$$VAR_{NEW} = \frac{VAR \cdot (N-1) + (VR_{NEW} - AVC) \cdot (VR_{NEW} - AVG_{NEW})}{N}, \qquad \text{[Equation 2]}$$

where '$VAR_{NEW}$' is the new variance and 'VAR' is the variance.

8. The method of claim 4, further comprising generating a new read voltage for re-reading the data related to the error correction failure when the error correction for the re-read data has failed.

9. The method of claim 2, wherein the determining the read voltage comprises:
    determining the average read voltage to be used in the next read operation when the new read voltage is determined not to belong to the section.

10. The method of claim 9, wherein the controlling the semiconductor memory device to perform the next read operation comprises controlling the semiconductor memory device to perform the next read operation using the average read voltage.

11. A controller for controlling a semiconductor memory device including a plurality of memory cells, the controller comprising:
    a read controller configured to control an operation for reading data stored in the semiconductor memory device; and
    an error correction block configured to perform an error correction operation on the data read from the semiconductor memory device,
    wherein the read controller controls the operation by:
    generating a new read voltage for re-reading the data when there is an error correction failure for the data,
    determining whether the new read voltage belongs to an allowable range, wherein the allowable range depending on a read voltage statistical value of previous successful read voltages, according to which previous read operations are successful, the read voltage statistical value includes an average and a variance of the previous successful read voltages,
    determining, based on a result of the determining whether the new read voltage belongs to the allowable range, one of the new read voltage and an average read voltage of the previously successful read voltages, according to which of the previous read operations were successful,
    controlling the semiconductor memory device to perform a next read operation of re-reading the data using the determined read voltage,
    receiving the data re-read from the semiconductor memory device through the next read operation, and updating, when error correction is successful for the re-read data received as a result of the next read operation, the read voltage statistical value with a new read voltage statistical value reflecting the determined read voltage.

12. The controller of claim 11, wherein the read controller comprises:
    a read voltage statistical value storage configured to store the read voltage statistical value;
    a read voltage generator configured to generate the new read voltage; and
    a read voltage determiner configured to determine whether the new read voltage belongs to the allowable range.

13. The controller of claim 12,
    wherein the read voltage determiner determines whether the new read voltage belongs to the allowable range by:
    calculating a standard deviation from the variance, and
    determining that the new read voltage belongs to the allowable range when the new read voltage belongs to a section between values 'AVG−k·σ' and 'AVG+k·σ', where 'AVG' is the average, 'σ' is the standard deviation and 'k' is a predetermined positive number, and
    wherein the read voltage determiner is further configured to generate a setting command for controlling the semiconductor memory device to use the new read voltage in the next read operation.

14. The controller of claim 13, wherein the read voltage determiner is further configured to
    transmit the new read voltage statistical value to the read voltage statistical value storage.

15. The controller of claim 14, wherein the read voltage determiner generates the new read voltage statistical value by generating a new average using equation 1:

$$AVG_{NEW} = \frac{N \cdot AVG + VR_{NEW}}{N+1}, \quad [\text{Equation 1}]$$

where '$AVG_{NEW}$' is the new average, 'N' is a number of previous successful read voltages, and '$VR_{NEW}$' is the new read voltage.

16. The controller of claim 15, wherein the read voltage determiner generates the new read voltage statistical value further by generating a new variance using equation 2:

$$VAR_{NEW} = \frac{VAR \cdot (N-1) + (VR_{NEW} - AVC) \cdot (VR_{NEW} - AVG_{NEW})}{N}, \quad [\text{Equation 2}]$$

where '$VAR_{NEW}$' is the new variance and 'VAR' is the variance.

17. The controller of claim 12,
    wherein the read voltage determiner determines whether the new read voltage belongs to the allowable range by:
    calculating a standard deviation from the variance, and
    determining that the new read voltage does not belong to the allowable range when the new read voltage does not belong to a section between values 'AVG−k·σ' and 'AVG+k·σ', where 'AVG' is the average, 'σ' is the standard deviation and 'k' is a predetermined positive number, and
    wherein the read voltage determiner is further configured to generate a setting command for controlling the semiconductor memory device to use the average read voltage in the next read operation.

18. The controller of claim 12, wherein the read voltage generator generates the new read voltage using a read retry table.

19. An operating method of a controller, the operating method comprising:
    selecting, when a previous read operation fails on data according to a previous read voltage, one of first and second read voltages based on whether the first read voltage falls within a range, the first read voltage being selected from a read retry table, the second read voltage being an average of successful read voltages, according to which previous read operations are successful, and the range depending on the average and a standard deviation of the successful read voltages;
    controlling a memory device to perform a current read operation on the data according to the selected read voltage; and
    updating the average and the standard deviation based on the selected read voltage when the current read operation is successful.

* * * * *